US011482861B2

(12) United States Patent
Choe et al.

(10) Patent No.: US 11,482,861 B2
(45) Date of Patent: Oct. 25, 2022

(54) APPARATUS, SERVER, SYSTEM AND METHOD FOR ENERGY MEASURING

(71) Applicant: Encored Technologies, Inc., Seoul (KR)

(72) Inventors: Jong-Woong Choe, Seoul (KR); Hyoseop Lee, Seoul (KR); Seonjeong Lee, Seoul (KR); Hyeri Yi, Paju (KR); Ilhan Ham, Seoul (KR)

(73) Assignee: ENCORED TECHNOLOGIES, INC., Seoul (KR)

( * ) Notice: Subject to any disclaimer, the term of this patent is extended or adjusted under 35 U.S.C. 154(b) by 483 days.

(21) Appl. No.: 14/819,705

(22) Filed: Aug. 6, 2015

(65) Prior Publication Data

US 2015/0357816 A1 Dec. 10, 2015

Related U.S. Application Data

(63) Continuation-in-part of application No. 14/526,916, filed on Oct. 29, 2014, now Pat. No. 10,436,824.

(30) Foreign Application Priority Data

Feb. 18, 2014 (KR) .................. 10-2014-0018391
Jul. 11, 2014 (KR) .................. 10-2014-0087330

(Continued)

(51) Int. Cl.
*G06Q 50/06* (2012.01)
*H02J 3/00* (2006.01)
(Continued)

(52) U.S. Cl.
CPC ............. *H02J 3/00* (2013.01); *G05B 11/01* (2013.01); *G06Q 30/018* (2013.01); *G06Q 50/06* (2013.01);
(Continued)

(58) Field of Classification Search
CPC ..................................... G06Q 50/06
(Continued)

(56) References Cited

U.S. PATENT DOCUMENTS 4,644,320 A * 2/1987 Carr ................ H02J 13/0006
340/12.37
2010/0117625 A1* 5/2010 Botts .................. F24C 7/082
324/103 R
(Continued)

FOREIGN PATENT DOCUMENTS

WO WO-2013147555 A1 * 10/2013 ........... G05B 13/024

OTHER PUBLICATIONS

C. Vivekananthan, Y. Mishra, G. Ledwich and F. Li, "Demand Response for Residential Appliances via Customer Reward Scheme," Mar. 2014, IEEE Transactions on Smart Grid, vol. 5, No. 2, pp. 809-820. (Year: 2014).*

*Primary Examiner* — Jeff Zimmerman
*Assistant Examiner* — Hunter A Molnar
(74) *Attorney, Agent, or Firm* — Quantum Patent Law Firm; Seongyoune Kang

(57) ABSTRACT

Accordingly the embodiments herein provides a method for load balancing in an energy measurement information system. The method includes collecting, by a power information collecting unit, power information at a snapshot extraction frequency. The snapshot extraction frequency is within a range. Further, the method includes detecting, by an operating status extracting unit, an operating status of at least one load apparatus at the snapshot extraction frequency. The operating status is one of a steady state and a transient state. Furthermore, the method includes generating, by a data set generating unit, a data set including only one or a representative snapshot of the power information, when the normal status is detected; and a data set including a
(Continued)

plurality of snapshots of the power information, when the transient state is detected.

20 Claims, 23 Drawing Sheets

(30) Foreign Application Priority Data

Jun. 5, 2015 (KR) ........................ 10-2015-0080222
Jul. 13, 2015 (WO) ................ PCT/KR2015/007234

(51) Int. Cl.
*G05B 11/01* (2006.01)
*G06Q 30/00* (2012.01)
*G01R 21/133* (2006.01)
*H02J 3/14* (2006.01)

(52) U.S. Cl.
CPC ............... *G01R 21/133* (2013.01); *H02J 3/14* (2013.01); *H02J 2310/14* (2020.01); *Y04S 50/14* (2013.01)

(58) Field of Classification Search
USPC ........................................................ 705/412
See application file for complete search history.

(56) References Cited

U.S. PATENT DOCUMENTS

| | | | |
|---|---|---|---|
| 2012/0310431 A1* | 12/2012 | Cheetham | G06Q 10/063 700/295 |
| 2013/0254151 A1* | 9/2013 | Mohagheghi | G06Q 30/0621 706/46 |
| 2014/0277769 A1* | 9/2014 | Matsuoka | G06Q 50/06 700/278 |
| 2014/0282172 A1* | 9/2014 | Bull | G06Q 10/06 715/771 |
| 2015/0345812 A1* | 12/2015 | Murthy | F24F 11/62 700/276 |

* cited by examiner

APPARATUS, SERVER, SYSTEM AND METHOD FOR ENERGY MEASURING

CROSS-REFERENCE TO RELATED APPLICATIONS

This application is a continuation-in-part of U.S. application Ser. No. 14/526,916, filed Oct. 29, 2014, which claims priority to Korean Application No. 10-2014-0018391, filed Feb. 18, 2014, the disclosures of which are incorporated herein by reference. This application also claims priority to PCT Application No. PCT/KR2015/007234, filed Jul. 13, 2015, which claims priority to Korean Application No. 10-2014-0087330, filed Jul. 11, 2014 and Korean Application No. 10-2015-0080222, filed Jun. 5, 2015, the disclosures of which are incorporated herein by reference.

TECHNICAL FIELD

The present invention relates to an energy measurement information system, and more particularly, to a system and a method for load balancing between an apparatus and a server.

BACKGROUND

A conventional energy measuring apparatus, through an Advanced Metering Infrastructure (AMI), Automatic Meter Reading (AMR), a digital power meter, or the like in the prior art, measures only total power usage information generated by whole individual load apparatuses associated to the energy measuring unit. In order to extract energy usage information of each load apparatus, either multiple energy measuring apparatuses are to be installed or a single energy measuring apparatus with multiple sensors needs to be installed in a distribution board. When an energy measuring apparatus is installed for each load apparatus, it requires more installation space thereby increasing the overall system cost. When the multiple sensors are used in the distribution board, the overall system cost increases based on adoption of the multiple sensors. Moreover, there will be a limit in acquiring the energy usage information for each of the load apparatuses.

In order to solve the above problems, various mechanisms to efficiently extract the energy usage information of each load apparatuses at a power penetration point are proposed. In one mechanism, a scheme is represented to extract the energy usage information of each of the load apparatuses through a series of computer operations performed for measuring signal information such as current, voltage, power, and the like. The measured signal information of each of the load apparatuses is then directly transmitted to a specific server. However, it is important to develop an energy measuring apparatus that can perform previous signal information processing to flexibly process, store, and manage massive data of the server. The previous signal information processing is associated with signal information sampling and clustering of a specific data set (for example, data corresponding to same load apparatus). In this case, the processed information needs to maintain resolution at a level to be distinguished for each of the individual load apparatuses while the server computer operates.

Thus, there remains a need of a robust system and method for individually measuring and labeling energy usage information of a plurality of load apparatus connected to a power penetration point.

SUMMARY OF INVENTION

Accordingly the embodiments herein provide an energy measuring apparatus, at a power penetration point, for load balancing in an energy measurement information system. The energy measuring apparatus includes a power information collecting unit configured to collect power information at a snapshot extraction frequency. The snapshot extraction frequency is within a range. The energy measuring apparatus includes an operating status extracting unit configured to detect an operating status of at least one load apparatus at the snapshot extraction frequency. The operating status is one of a steady state and a transient state. Furthermore, the energy measuring apparatus includes a data set generating unit configured to generate a data set including a representative snapshot of the power information when the normal status is detected; and generate a data set including a plurality of snapshots of the power information when the transient state is detected.

In an embodiment, the range is 10 to 900 per second.

In an embodiment, the representative snapshot is selected based on a mensuration method.

In an embodiment, the energy measuring apparatus includes a transmitting unit configured to transmit the representative snapshot of the power information, when the normal status is detected; and transmit the plurality of snapshots of the power information, when the transient state is detected.

In an embodiment, the power information collecting unit is configured to collect the power information. The power information includes a power signal at the power penetration point for the plurality of load apparatuses.

In an embodiment, the snapshot of the power information includes one of a voltage snapshot and a current snapshot of a waveform having a predetermined cycle as the power information.

Accordingly the embodiments herein provide a server for load management in an energy measurement information system. The server including a controller unit configured to compute a signal correlation to reflect power information of at least one load apparatus based on a snapshot of power signal. The snapshot of power signal is related to one of a voltage snapshot and a current snapshot of a waveform having a predetermined cycle measured at a distant energy measuring apparatus. Further, the controller unit is configured to classify the power information based on component units constituting the at least one load apparatus based on the signal correlation, the power information is classified as one of an on operation and an off operation. Further, the controller unit is configured to generate a data set for the at least one load apparatus based on the classified power information.

In an embodiment, the one of a multi-steps operation and a continuous change operation is classified into an association group with one of the on operation and the off operation with respect to same load apparatus based on the signal correlation.

In an embodiment, the signal correlation includes at least one of voltage correlation, current correlation, high-frequency distortion, power signal deformation, active power correlation, and reactive power correlation.

In an embodiment, the controller unit is configured to map and recombine the classified data set according to a time domain; and label the recombined data sets.

In an embodiment, the operating status is used to distinguish a distribution plane for each the load apparatus.

Accordingly the embodiments herein provide an energy measurement information system. The energy measurement information system includes an energy measuring apparatus configured to collect power information at a snapshot extraction frequency. The snapshot extraction frequency is within a threshold. Further, energy measuring apparatus is configured to extract one of an operating status of at least one of load apparatuses at the snapshot extraction frequency. The operating status is one of a steady state and a transient state; and the apparatus generates and transmits one of only one or a representative snapshot and a plurality of snapshots of the power information based on the operating status. Further, the energy measurement information system includes a server configured to compute a signal correlation to reflect the power information of at least one load apparatus based on a snapshot of power signal. The snapshot of power signal is related to one of a voltage snapshot and a current snapshot of a waveform having a predetermined cycle measured at a distant energy measuring apparatus. The server is configured to classify the power information based on component units constituting the at least one load apparatus based on the signal correlation, the power information is classified as one of an on operation and an off operation. Further, the server is configured to generate a data set for the at least one load apparatus based on the classified power information.

In an embodiment, the server is configured to map and recombine the classified data set according to a time domain; and label the recombined data sets.

In an embodiment, the energy measuring apparatus is configured to collect the power information. The power information includes a power signal at the power penetration point for the plurality of load apparatuses.

Accordingly the embodiments herein provide a method for load balancing in an energy measurement information system. The method includes collecting, by a power information collecting unit, a power information at a snapshot extraction frequency. The snapshot extraction frequency is within a range. Further, the method includes detecting, by an operating status extracting unit, an operating status of at least one load apparatus at the snapshot extraction frequency. The operating status is one of a steady state and a transient state. Furthermore, the method includes generating, by a data set generating unit, a data set including a representative snapshot of the power information, when the normal status is detected; and a data set including a plurality of snapshots of the power information, when the transient state is detected.

In an embodiment, the snapshot is selected based on a mensuration method.

In an embodiment, the method includes transmitting, by a transmitting unit, the representative snapshot of the power information, when the normal status is detected; and transmitting, by a transmitting unit, the plurality of snapshots of the power information, when the excessive status is detected.

In an embodiment, the power information collecting unit is configured to collect the power information, wherein the power information includes a power signal at the power penetration point for the plurality of load apparatuses.

In an embodiment, the snapshot of the power information includes one of a voltage snapshot and a current snapshot of a waveform having a predetermined cycle as the power information.

Accordingly the embodiments herein provide a method for load management in an energy measurement information system. The method including computing, at a server, a signal correlation to reflect power information of at least one load apparatus based on a snapshot of power signal, the snapshot of power signal is related to one of a voltage snapshot and a current snapshot of a waveform having a predetermined cycle measured at a distant energy measuring apparatus. Further, the method includes classifying, at the server, the power information based on component units constituting the at least one load apparatus based on the signal correlation, the power information is classified as one of an on operation and an off operation. Furthermore, the method includes generating, at the server, a data set for the at least one load apparatus based on the classified power information.

In an embodiment, one of a multi-steps operation and a continuous change operation is classified into an association group with one of the on operation and the off operation with respect to same load apparatus based on the signal correlation.

In an embodiment, the signal correlation includes at least one of voltage correlation, current correlation, high-frequency distortion, power signal deformation, active power correlation, and reactive power correlation.

In an embodiment, the method includes mapping and recombining, at the server, the classified data set according to a time domain; and labeling, at the server, the recombined data sets.

In an embodiment, the operating status is used to distinguish a distribution plane for each the load apparatus.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein includes all such modifications.

BRIEF DESCRIPTION OF THE FIGURES

This invention is illustrated in the accompanying drawings, throughout which like reference letters indicate corresponding parts in the various figures. The embodiments herein will be better understood from the following description with reference to the drawings, in which.

DETAILED DESCRIPTION OF INVENTION

Figure 1:
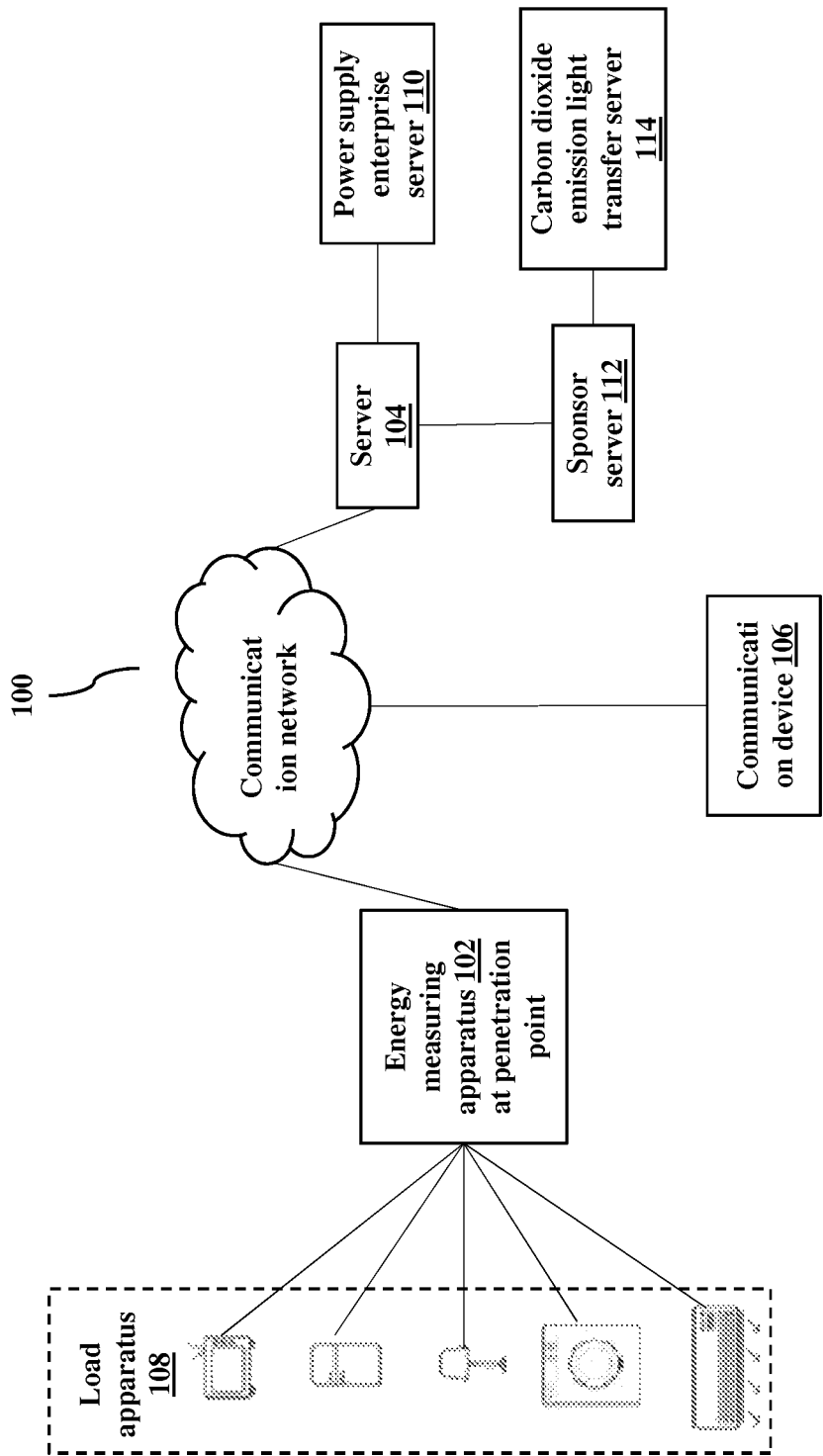
FIG. 1 illustrating a high level overview of a system for managing a power demand and load balancing, according to an embodiment as disclosed herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

Prior to describing the present invention in detail, it is useful to provide definitions for key terms and concepts used herein. Unless defined otherwise, all technical and scientific terms used herein have the same meaning as commonly understood by one of ordinary skill in the art to which this invention belongs.

Request signal: A request signal for power usage reduction may include information on at least one of reduction requirement of power consumption for power usage, a reduction required time period, a reduction required region, or the like. For example, the request signal may include information that instructs 10,000 kWh (reduction required power consumption) for 2 P.M. to 5 P.M. on May 1, 2015 (reduction required time period). Furthermore, the request signal may include information that designates a specific region (e.g., Suwon-si, Gangnamgu of Seoul, or the like) as the reduction required region.

Subscriber information: The subscriber information described herein may include at least one of information on power consumption and predicted consumption by all load apparatuses or each load apparatus for each subscriber, a probability distribution function of reduction for all load apparatuses or each load apparatus by compensation for each subscriber, or the like. Further, the subscriber information may include registration information on a communicating device, a load apparatus of the subscriber, information on a power usage fee for each subscriber, or the like.

Guidance information: The guidance information of the power usage reduction may include information on at least one of reduced power consumption requested for a subscriber (which is selected to request the power usage reduction), a power usage status of the corresponding subscriber, the reduction required time period, predicted compensation by reduction, or the like. The guidance information may be provided to all load apparatuses or individual load apparatuses used by the subscriber.

Compensation Information: The information on compensation for the power usage reduction may include information on a discount of the power usage fee granted to the corresponding subscriber, points usable at the time of paying the power usage fee in proportion to actually reduced power consumption to correspond to the guidance information, or the like.

The embodiments herein provide a server for managing power demand. The server includes a storage unit configured to store subscriber information, a receiving unit configured to receive a request signal for power usage reduction, a selecting unit configured to select a subscriber corresponding to the request signal based on the subscriber information, a transmitting unit configured to transmit guidance information for the power usage reduction to a communicating device of the subscriber, a monitoring unit configured to monitor the power consumption by at least one load apparatus of the selected subscriber, and a compensation managing unit configured to grant a compensation to the subscriber, when the power consumption by the at least one load apparatus reduces in accordance to the guidance information.

Accordingly, the embodiments herein achieve an energy measuring apparatus, at a power penetration point, for load balancing in an energy measurement information system. The energy measuring apparatus includes a power information collecting unit configured to collect power information at a snapshot extraction frequency. The snapshot extraction frequency is within a range. The energy measuring apparatus includes an operating status extracting unit configured to detect an operating status of at least one load apparatus at the snapshot extraction frequency. The operating status is one of a steady state and a transient state. Furthermore, the energy measuring apparatus includes a data set generating unit configured to generate a data set including a representative snapshot of the power information when the normal status is detected; and generate a data set including a plurality of snapshots of the power information when the transient state is detected.

Accordingly the embodiments herein achieve a server for load management in an energy measurement information system. The server including a controller unit configured to compute a signal correlation to reflect power information of at least one load apparatus based on a snapshot of power signal. The snapshot of power signal is related to one of a voltage snapshot and a current snapshot of a waveform having a predetermined cycle measured at a distant energy measuring apparatus. Further, the controller unit is configured to classify the power information based on component units constituting the at least one load apparatus based on the signal correlation, the power information is classified as one of an on operation and an off operation. Further, the controller unit is configured to generate a data set for the at least one load apparatus based on the classified power information. In an embodiment, the controller unit is configured to map and recombine the classified data set according to a time domain; and label the recombined data sets.

Accordingly the embodiments herein achieve an energy measurement information system. The energy measurement information system includes an energy measuring apparatus configured to collect power information at a snapshot extraction frequency. The snapshot extraction frequency is within a threshold. Further, energy measuring apparatus is configured to extract one of an operating status of at least one of load apparatuses at the snapshot extraction frequency. The operating status is one of a steady state and a transient state; and generate and transmit one of a representative snapshot and a plurality of snapshots of the power information based on the operating status. Further, the energy measurement information system includes a server configured to compute a signal correlation to reflect the power information of at least one load apparatus based on a snapshot of power signal. The snapshot of power signal is related to one of a voltage snapshot and a current snapshot of a waveform having a predetermined cycle measured at a distant energy measuring apparatus. The server is configured to classify the power information based on component units constituting the at least one load apparatus based on the signal correlation, the power information is classified as one of an on operation and an off operation. Further, the server is configured to generate a data set for the at least one load apparatus based on the classified power information. In an embodiment, the server is configured to map and recombine the classified data set according to a time domain; and label the recombined data sets.

Accordingly the embodiments herein achieve a method for load balancing in an energy measurement information system. The method includes collecting, by a power information collecting unit, power information at a snapshot extraction frequency. The snapshot extraction frequency is within a range. Further, the method includes detecting, by an operating status extracting unit, an operating status of at least one load apparatus at the snapshot extraction frequency. The operating status is one of a steady state and a transient state. Furthermore, the method includes generating, by a data set generating unit, a data set including a representative snapshot of the power information, when the normal status is detected; and a data set including a plurality of snapshots of the power information, when the transient state is detected.

Accordingly the embodiments herein achieve a method for load management in an energy measurement information system. The method including computing, at a server, a signal correlation to reflect power information of at least one load apparatus based on a snapshot of power signal, the snapshot of power signal is related to one of a voltage snapshot and a current snapshot of a waveform having a predetermined cycle measured at a distant energy measuring apparatus. Further, the method includes classifying, at the server, the power information based on component units constituting the at least one load apparatus based on the signal correlation, the power information is classified as one of an on operation and an off operation. Furthermore, the method includes generating, at the server, a data set for the at least one load apparatus based on the classified power information. In an embodiment, the method includes mapping and recombining, at the server, the classified data set according to a time domain; and labeling, at the server, the recombined data sets.

Referring now to the drawings and more particularly to FIGS. 1 to 19 where similar reference characters denote corresponding features consistently throughout the figures, there are shown preferred embodiments.

FIG. 1 illustrating a high level overview of a system 100 for managing power demand and load balancing, according to an embodiment as disclosed herein. In an embodiment, the system 100, for managing the power demand and the load balancing, may include an energy measuring apparatus 102 at a power penetration point, a server 104, a communicating device 106, at least one load apparatus 108 used by the subscriber of the communicating device 106, and a power supply enterprise related server 110.

In an embodiment, the system 100 may be additionally connected with a sponsor server 112 and a carbon dioxide emission right transaction server 114.

The server 104 may include a function of managing the power demand and the load balancing between the energy measuring apparatus 102 at the penetration point and the server 104. In an embodiment, the server 104 described herein is the same as a labeling server 700 to be described in the FIG. 7 (in the same configuration as described in the FIG. 1). In this case, the server 104 may further include components as compared with the labeling server 700 in order to perform the power demand managing functions. In an embodiment, the server 104 may be a server which is provided separately from the labeling server 700 in order to perform the power demand managing functions (this may have a separate configuration).

The labeling server 700 is not illustrated in the FIG. 1, but it may be assumed that the server 104 performs a function of the labeling server 700 (in the case of the same configuration) or the system 100 further includes the labeling server 700 apart from the server 104 (in the case of the separate configuration).

The communicating device 106 described herein is registered as a communicating device of a subscriber with the server 104 for data communication with the server 104. Some non-limiting examples of the communicating device 106 may include mobile apparatus, a smart phone, a notebook, a tablet PC, fixed home appliances (e.g., a TV, a refrigerator, an air-conditioner, or the like), or the like.

In an embodiment, the energy measuring apparatus 102 includes a power information collecting unit configured to collect power information at a snapshot extraction frequency. The snapshot extraction frequency is within a range 10 to 900 per second. The energy measuring apparatus 102 is configured to detect an operating status of at least one load apparatus at the snapshot extraction frequency. The operating status described herein can be one of a steady state and a transient state. Furthermore, the energy measuring apparatus 102 can be configured to generate a data set including a representative snapshot of the power information when the normal status is detected; and generate a data set including a plurality of snapshots of the power information when the transient state is detected.

Further, in an embodiment, the server 104 is configured to compute a signal correlation to reflect power information of at least one load apparatus based on a snapshot of power signal. The snapshot of power signal is related to one of a voltage snapshot and a current snapshot of a waveform having a predetermined cycle measured at a distant energy measuring apparatus. Further, the server 104 is configured to classify the power information based on component units constituting the at least one load apparatus based on the signal correlation, the power information is classified as one of an on operation and an off operation. Further, the server 104 is configured to generate a data set for the at least one load apparatus based on the classified power information.

Furthermore, the server 104 is configured to map and recombine the classified data set according to a time domain; and label the recombined data sets.

The FIG. 1 illustrates a limited overview of the system 100 for managing the power demand and the load balancing between the energy measuring apparatus 102 at the penetration point and the server 104 but, it is to be understood that other embodiments are not limited thereto. The labels provided to each unit, device or component is only for illustrative purpose and does not limit the scope of the invention. Further, the one or more unit, device or component can be combined or separated to perform the similar or substantially similar functionalities without departing from the scope of the invention. Furthermore, the system 100 can include various other components interacting locally or remotely along with other hardware or software components for managing the power demand and the load balancing between the energy measuring apparatus 102 at the penetration point and the server 104. For example, the component can be, but is not limited to, a process running in the controller or processor, an object, an executable process, a thread of execution, a program, or a computer.

Figure 2:
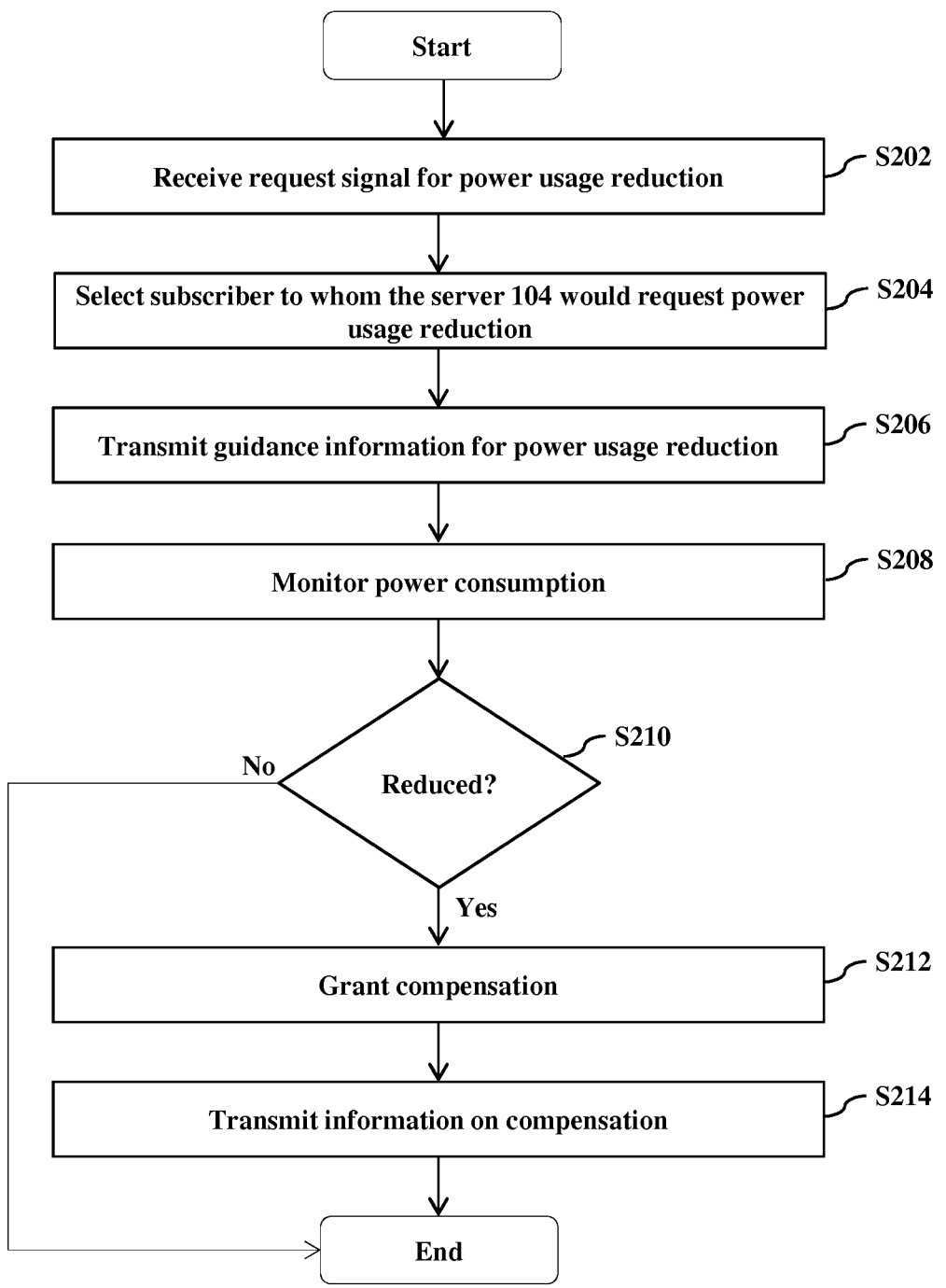
FIG. 2 is a flowchart illustrating a method for managing power usage, according to an embodiment as disclosed herein.

FIG. 2 is a flowchart illustrating a method for managing power usage, according to an embodiment as disclosed herein. At S202, the method includes receiving a request signal for power usage reduction. In an embodiment, the method allows the server 104 to receive the request signal for the power usage reduction from the power supply enterprise related server 110.

At S204, the method includes selecting the subscriber to whom the server 104 would request the power usage reduction. In an embodiment, the method allows the server 104 to select the subscriber and request the power usage reduction by using subscriber information with receiving the request signal. The server 104 described herein may store the subscriber information and update the subscriber information by reflecting a power usage status or pattern of the subscriber, or update the subscriber information according to a request by the subscriber.

In an embodiment, the server 104 may select at least one subscriber and request the power usage reduction according to a predetermined criterion considering power consumption, predicted power consumption, probability distribution of reduction depending on compensation, or the like. The server 104 may select a subscriber that is predicted to carry out the power usage reduction request with minimum cost. Alternatively, the server 104 may select a subscriber that is predicted to respond to the power usage reduction request with a high probability. The details about the section of the subscriber are described in conjunction with the FIG. 3.

At S206, the method includes transmitting guidance information for power usage reduction. In an embodiment, the method allows the server 104 to transmit the guidance information for the power usage reduction to the communicating device 106 of the subscriber selected in the step (S204).

At S208, the method includes monitoring the power consumption. In an embodiment, the method allows the server 104 to monitor the power consumption by at least one load apparatus of the selected subscriber. At S210, the method includes determining whether the actual power consumption is reduced and the reduced power consumption in the load apparatus of the selected subscriber corresponds to the guidance information. In an embodiment, the method allows the server 104 to verify whether the actual power consumption is reduced and the reduced power consumption in the load apparatus of the selected subscriber corresponds to the guidance information transmitted in the step (S206). The monitoring of the power consumption may be appreciated with reference to the aforementioned description of the collection and extraction of the data regarding the power usage by the labeling server 700 as described in the FIG. 7.

At S212, the method includes granting a predetermined compensation to the corresponding subscriber. In an embodiment, when the server 104 determines that the power consumption is reduced to correspond to the guidance information, the server 104 may grant a compensation corresponding to the power consumption reduction. The server 104 may decide the compensation to be granted to the corresponding subscriber by considering the actual reduced power consumption to correspond to the guidance information.

For example, the server 104 may grant the compensation in proportion to the reduced power consumption. Further, the server 104 may grant the compensation for a power consumption fee and grant the compensation as a discount on the power consumption fee or giving points usable for paying the power consumption fee.

Alternatively, in an embodiment, the compensation may include cash, a gift, a coupon, or the like provided by the sponsor server 112 in addition to the power supply enterprise related server 110. In this case, the server 104 may receive the cash, the gift, the coupon, or the like from the sponsor server 112 in an electronic form. Alternatively, the server 104 may save conversion points in an electronic form to correspond to the cash, the gift, or the coupon received from a sponsor in an account of the corresponding sponsor. The server 104 calculates the reduced power consumption corresponding to the cash, the gift, the coupon, or the conversion points received for each sponsor. Further, the sponsor server 112 may acquire a carbon dioxide emission right from the carbon dioxide emission right transaction server 114 based on the calculated reduced power consumption. In this case, 'based on the reduced power consumption' may non-exclusively refers to all cases in which the reduced power consumption is converted into a reduced carbon dioxide amount based on the reduced power consumption and those skilled in the art may convert the reduced power consumption into a reduced carbon dioxide amount by using the conventional method known or to be known in the art. Further, the carbon dioxide emission right transaction server 114 may verify that the power is reduced as much as the cash, the gift, the coupon, or the like provided by the sponsor server 112 from the power supply enterprise related server 110 or the server 104.

Further, at S214, the method includes transmit information regarding the compensation to the communicating device 106. In an embodiment, the method allows the server 104 to transmit compensation information about the granted compensation to the communicating device 106 of the corresponding subscriber. The subscriber of the communicating device 106 may verify whether the actual power consumption fee is discounted by a user power reduction act and a discount degree. This may show an effect of inducing the subscriber to positively participate in reducing the power at a time when the power reduction is required.

Unlike the conventional systems and methods, a power usage reduction scheme based on a non-intrusive load monitoring for power usage of a subscriber can be implemented without construction of an expensive system for the power usage reduction. Further, the power usage reduction is performed by considering a time period in which the power usage reduction is required. The power usage reduction is induced for a subscriber which can carry out the given power usage reduction with minimum cost to increase power reduction efficiency. The power usage reduction is compensated to induce the subscriber to positively participate in the power usage reduction. Furthermore, the proposed system and method can be implemented using existing infrastructure and may not require extensive setup and instrumentations.

The various actions, acts, blocks, steps, or the like of the FIG. 2 may be performed in the order presented, in a different order or simultaneously. Further, in some embodiments, some of the actions, acts, blocks, steps, or the like may be omitted, added, modified, skipped, or the like without departing from the scope of the invention.

Figure 3:
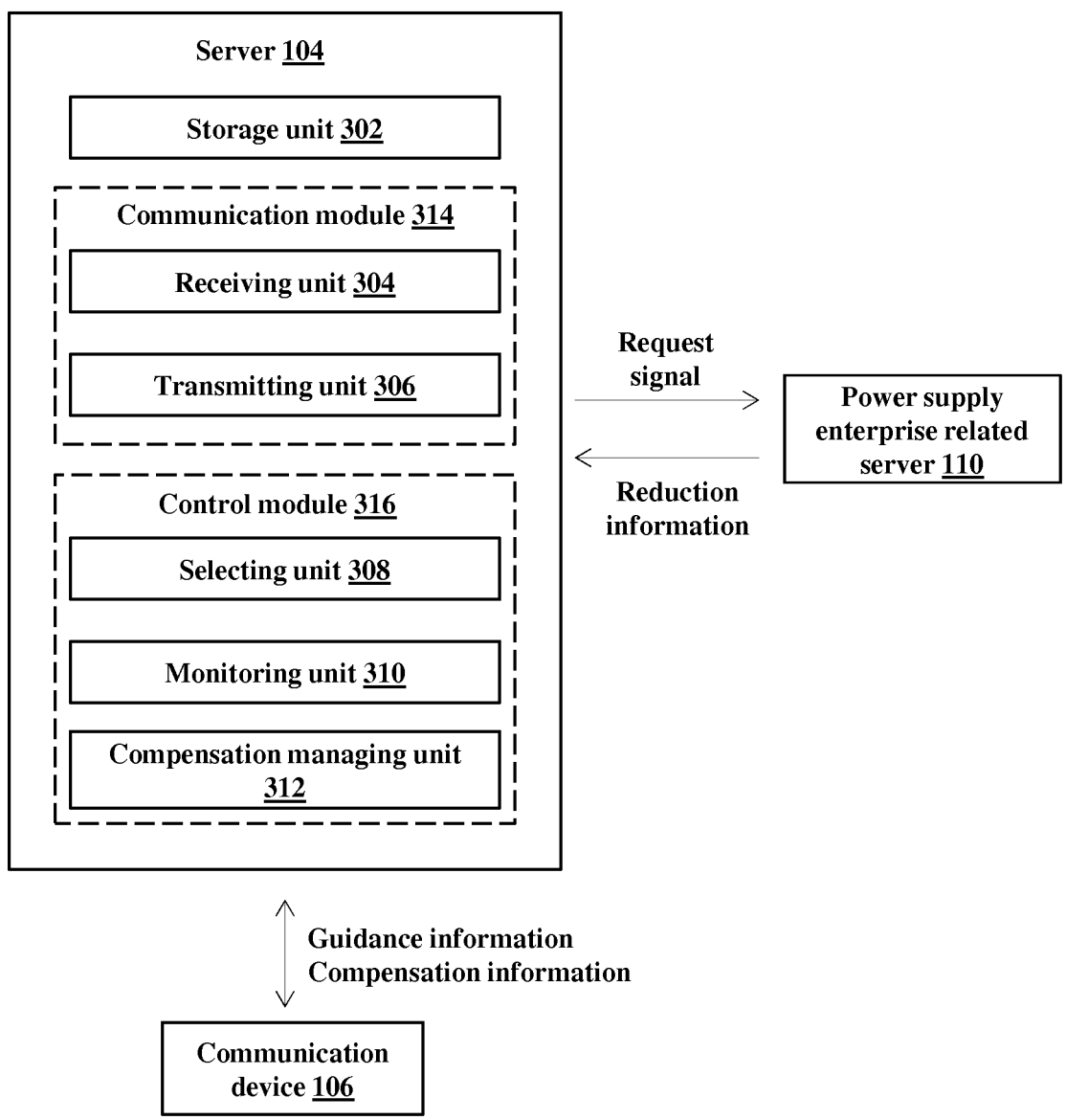
FIG. 3 is a block diagram of a server for managing a power demand, according to an embodiment as disclosed herein.

FIG. 3 is a block diagram of the server 104 for managing the power demand and the load balancing, according to an embodiment as disclosed herein. In an embodiment, the server 104 may include a storage unit 302 storing the subscriber information, a receiving unit 304 receiving the request signal for the power usage reduction, a transmitting unit 306 transmitting the guidance information for the power usage reduction to the communicating device of the selected subscriber, a selection unit 308 selecting the subscriber and request the power usage reduction by using the subscriber information with receiving the request signal, a monitoring unit 310 monitoring the power consumption by the load apparatus of the selected subscriber, and a compensation managing unit 312 granting a predetermined compensation to the corresponding subscriber when the power consumption by the load apparatus is reduced according to the guidance information.

The receiving unit 304 and the transmitting unit 306 may be implemented as respective units or one communication unit 314. Further, the selection unit 308, the monitoring unit 310, and the compensation managing unit 312 may be implemented as respective units or one control unit 316.

The receiving unit 304 and the transmitting unit 306 may be implemented as respective modules or one communication module 314. Further, the selection unit 308, the monitoring unit 310, and the compensation managing unit 312 may be implemented as respective modules or one control module 316.

The storage unit 302 may store the subscriber information and in particular, store information on the power usage for each subscriber. For example, the storage unit 302 may store, as the subscriber information, information on the power consumption by all the load apparatuses or an individual load apparatuses for each subscriber, a temporal power usage profile, a power reduction history according to the guidance information, or the like. In more detail, the power reduction history according to the guidance information may include information regarding whether the power consumption is actually reduced, the reduced power consumption, a load apparatus that reduces the power consumption, or the like to correspond to the previous guidance information including the compensation method and the amount of compensation.

The receiving unit 304 may receive the request signal for the power consumption reduction from the power supply enterprise related server 110 before the start of a time period when the power usage reduction is required.

For example, the power supply enterprise related server 110 may transmit the request signal one week, one day, or one hour before the start of the time period when the power usage reduction is required. This is used to induce the positive power usage reduction act by providing the guidance information for the power usage reduction to the subscriber before the time period when the power usage reduction is required.

The selecting unit 308 may select at least one subscriber to whom the server 104 would request the power usage reduction according to a predetermined criterion considering the power consumption, the temporal power consumption, the probability distribution of the reduction depending on the compensation, or the like. Therefore, the server 104 may select a subscriber that is predicted to carry out the power usage reduction request with minimum cost. Alternatively, the server 104 may select a subscriber that is predicted to respond to the power usage reduction request with the highest probability.

For example, the selecting unit 308 may select at least one subscriber so as to reduce the power usage with the minimum cost by considering a power consumption degree at the reduction required time period, a prediction value of the power consumption at the reduction required time period, a response rate to the existing power usage reduction or reduced power consumption, the probability distribution of the reduction depending on the compensation, or the like. In an embodiment, the probability distribution of the reduction depending on the compensation may be estimated based on the actual reduced power consumption for the past power usage reduction request. Further, a usage change of a user for a fee change depending on a progressive accumulation step may also be used to generate a probability distribution of the reduction by the compensation. The probability distribution of achieving a reduction object depending on the compensation may vary depending on the predicted power consumption for each load apparatus or of all the load apparatuses at a reduction target time. An example graph illustrating a probability distribution of achieving reduction for a reduction request amount depending on the amount of compensation per different unit usage estimated for each subscriber is described in conjunction with the FIG. 12.

The selecting unit 308 calculates the unit amount of compensation to satisfy the reduction required power consumption with the minimum cost and the amount $\Delta i$ of reduction request for each of the individual users (i=1, ... n). The amount of compensation is calculated by considering a probability distribution Fi ($\Delta$; p) of reduction depending on compensation configured for each of individual users with respect to reduced request power consumption W and the amount p of compensation per unit usage included in the request signal.

Find $\Delta i$, p
that minimizes $$\sum_i \Delta_i \times p$$

such that $$W \left| \sum_i \Delta_i \times F_i(\Delta_i; p) \right.$$

Herein, a probability distribution function of the reduction is estimated for each of the individual apparatuses to calculate the amount of reduction request for each of the individual apparatuses. Alternatively, the selecting unit 308 may select the subscriber so that expectation values of the response rate for each subscriber or each subscriber load apparatus and the usage reduction history satisfy the reduction required power consumption included in the request signal.

Further, the selecting unit 308 may select the subscriber by calculating the anticipated reduction required power consumption, which is more than the reduction required power consumption included in the request signal by a predetermined amount. This is to provide against the presence of a subscriber that does not participate in the power reduction among the selected subscribers.

For example, the selecting unit 308 may select the subscriber so that total anticipated reduction required power consumption becomes 20,000 kWh by considering power consumption at 2 P.M., and response rate and a reduction amount depending on the previous guidance information when receiving the request signal (requesting reduction of 10,000 kW at 2 P.M. tomorrow). In this case, the selecting unit 308 calculates twice the reduction required power consumption included in the request signal as the anticipated reduction required power consumption to select the subscriber based on the calculated anticipated reduction required power consumption when the power reduction response rate for the existing guidance information is 50%.

Further, the selecting unit 308 may select the subscriber to whom the server 104 would request the power usage reduction except for a subscriber that generally uses basic power during the reduction required time period. Herein, the basic power may mean stand-by power of the load apparatus or minimum power for maintaining an activation state. When a power reduction possibility of a load apparatus using only the basic power is very low, the selecting unit 308 may exclude the corresponding load apparatus from as elected target of the power reduction.

For example, the selecting unit 308 calculates a power value acquired by subtracting basic power consumption from the predicted power consumption during the time period. This requires the power usage reduction with respect to all subscribers and determines the calculated power value as reduced power consumption to calculate the anticipated reduction required power consumption, and reduction required power consumption for each reduction required subscriber and each subscriber within reducible power consumption.

Further, when the selected subscriber uses multiple load apparatuses, the selecting unit 308 may decide total reduced power consumption required for the selected subscriber, and the reduction required power consumption for each power reducible load apparatus or each load apparatus.

In addition, when information on a specific region in which the power reduction is required is included in the request signal, the selecting unit 308 may select a subscriber that to whom the server 104 would request the power reduction among subscribers that reside in the specific region.

The transmitting unit 306 may transmit guidance information for the power usage reduction to the communicating device 106 of the subscriber selected by the selecting unit 308.

For example, the guidance information may include the time period in which the power reduction is required, the reduction required power consumption, reducible power consumption for all the load apparatuses or the individual load apparatuses, a guide (e.g., lower a temperature of an air-conditioner to a predetermined temperature, increase a freezing or refrigeration temperature of a refrigerator, unplug from a socket of an unused electronic product, or the like) for the power usage reduction, compensation information depending on the power usage reduction, or the like.

The monitoring unit 310 may monitor the power consumption by the load apparatus of the selected subscriber after transmitting the guidance information. This is to determine whether the power consumption by the load apparatus of the subscriber is actually reduced or a degree of the reduced power consumption to correspond to the guidance information and grant the compensation.

When the power consumption by the load apparatus of the selected subscriber is reduced according to the transmitted guidance information, the compensation managing unit 312 may grant a predetermined compensation to the corresponding subscriber in proportion to the reduced power consumption. In more detail, the compensation managing unit 312 may grant the compensation for the power consumption fee.

For example, the compensation managing unit 312 may grant the compensation by providing discount on the power consumption fee or by giving the points usable for paying the power consumption fee. Alternatively, the compensation managing unit 312 may grant the cash, the gift, the coupon, or the like received from the sponsor server 112 as the compensation.

Furthermore, the transmitting unit 306 may transmit information (hereinafter, referred to as reduction information) on the power reduction according to the guidance information for each subscriber to the power supply enterprise related server 110. The power supply related server 110 may decide a compensation corresponding to whether the power is reduced and the reduced power consumption included in the reduction information and transmit information on the decided compensation to the server 104. Therefore, the compensation managing unit 312 may grant the compensation for the corresponding subscriber based on the information on the compensation received from the power supply related server 110.

Meanwhile, the compensation managing unit 312 may previously define a compensation grant criterion based on whether the power is reduced and the reduced power consumption according to the guidance information and grant the compensation for the corresponding subscriber based on the compensation grant criterion.

The transmitting unit 306 may transmit information (hereinafter, referred to as compensation information) regarding the granted compensation to the communicating device 106 of the corresponding subscriber.

Further, in an embodiment, the controller unit 316 is configured to compute a signal correlation to reflect power information of at least one load apparatus based on a snapshot of power signal, wherein the snapshot of power signal is related to one of a voltage snapshot and a current snapshot of a waveform having a predetermined cycle measured at a distant energy measuring apparatus. Further, the controller unit 316 is configured to classify the power information based on component units constituting the at least one load apparatus based on the signal correlation, wherein the power information is classified as one of an on operation and an off operation. Further, the controller unit 316 is configured to generate a data set for the at least one load apparatus based on the classified power information. Further, the controller unit 316 is configured to map and recombine the classified data set according to a time domain; and label the recombined data sets.

The FIG. 3 illustrates a limited overview of the server 104 for managing a power demand based but, it is to be understood that other embodiments are not limited thereto. The labels provided to each unit or module is only for illustrative purpose and does not limit the scope of the invention. Further, the one or more units or modules can be combined or separated to perform the similar or substantially similar functionalities without departing from the scope of the invention. Furthermore, the server 104 can include various other components interacting locally or remotely along with other hardware or software components to manage the power demand.

Figure 4:
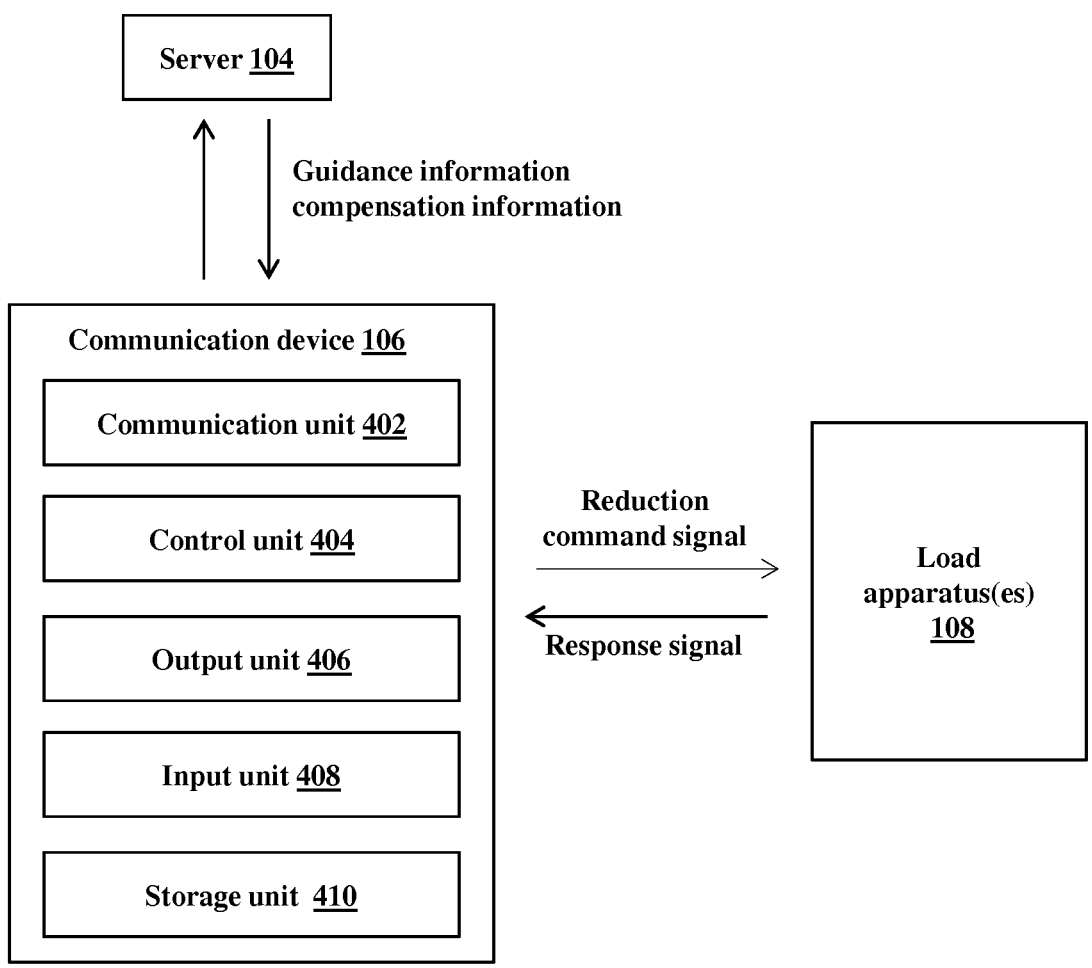
FIG. 4 is a block diagram of a communicating device for managing the power demand, according to an embodiment as disclosed herein.

FIG. 4 is a block diagram of the communicating device 106 for managing the power demand, according to an embodiment as disclosed herein. In an embodiment, the communicating device 106 may include a communication unit 402 receiving guidance information for the power usage reduction from the server 104, a control unit 404 executing a power related application with receiving the guidance information, and an output unit 406 outputting the guidance information by executing the power related application. Further, the communicating device 106 may further include a storage unit 410 storing the power related application, the guidance information, the compensation information, or the like.

The control unit 404 may control an operation of at least one of the communication unit 402, the output unit 406, an input unit 408, and the storage unit 408. The power related application means an application for managing power usage of the load apparatuses possessed by a subscriber of the communicating device 106 and may be installed while producing the communicating device 106 or installed by being downloaded from an external server by subscriber's selection.

The control unit 404 may automatically execute the power related application or execute the power related application only when providing a guidance information receiving notice to the subscriber and thereafter, receiving an execution command from the subscriber, when receiving the guidance information.

For example, the guidance information receiving notice may express a brief content of the guidance information and output vibration/lamp/notice sound for just notifying whether to receive the guidance information. The output of the guidance information is described in conjunction with the FIGS. 5A and 5B.

Further, the communication unit 402 may receive the information (hereinafter, referred to as compensation information) regarding the compensation granted to correspond to the power usage reduction according to the guidance information from the server 104 and the output unit 406 executes the power related application to output the received compensation information. The output of the compensation information is described in conjunction with the FIG. 6.

Since the receiving notice of the compensation information may be described by citing the description of the receiving notice of the guidance information, a detailed description thereof will be omitted for the sake of brevity.

Further, the communicating device 106 may further include the input unit 408 receiving a power reduction command for at least one load apparatus by executing the power related application. The communication unit 402 may transmit the power reduction command signal to a load apparatus 108 corresponding to the power reduction command.

For example, the communicating device 106 may receive a command or selection associated with an operation control (e.g., power on/off, a temperature control of the air-conditioner/refrigerator, or the like) for each load apparatus from the subscriber through the input unit 408. In more detail, the input unit 408 may receive selection of a load apparatus of which power is intended to be reduced from the subscriber or receive a power reduction method for each load apparatus.

The load apparatus 108 may reduce power consumption to correspond to a power reduction command signal when receiving the power reduction command signal. In an embodiment, the load apparatus 108 may transmit a response (hereinafter, referred to as a response signal) to whether a power reduction operation is performed to correspond to the power reduction command signal to the communicating device 106.

For example, when the load apparatus 108 is a refrigerator and the power reduction command signal includes a recommended freezing or refrigeration room temperature for a predetermined time, the recommended freezing or refrigeration room temperature may be maintained for a predetermined time. Alternatively, when the load apparatus 108 is a computer and the power reduction command signal includes a power off command, power of the computer may be turned off.

The FIG. 5 illustrates a limited overview of the communication device 106 for managing a power demand based but, it is to be understood that other embodiments are not limited thereto. The labels provided to each unit are only for illustrative purpose and does not limit the scope of the invention. Further, the one or more units can be combined or separated to perform the similar or substantially similar functionalities without departing from the scope of the invention. Furthermore, the communication device 106 can include various other components interacting locally or remotely along with other hardware or software components to manage the power demand.

Figure 5A:
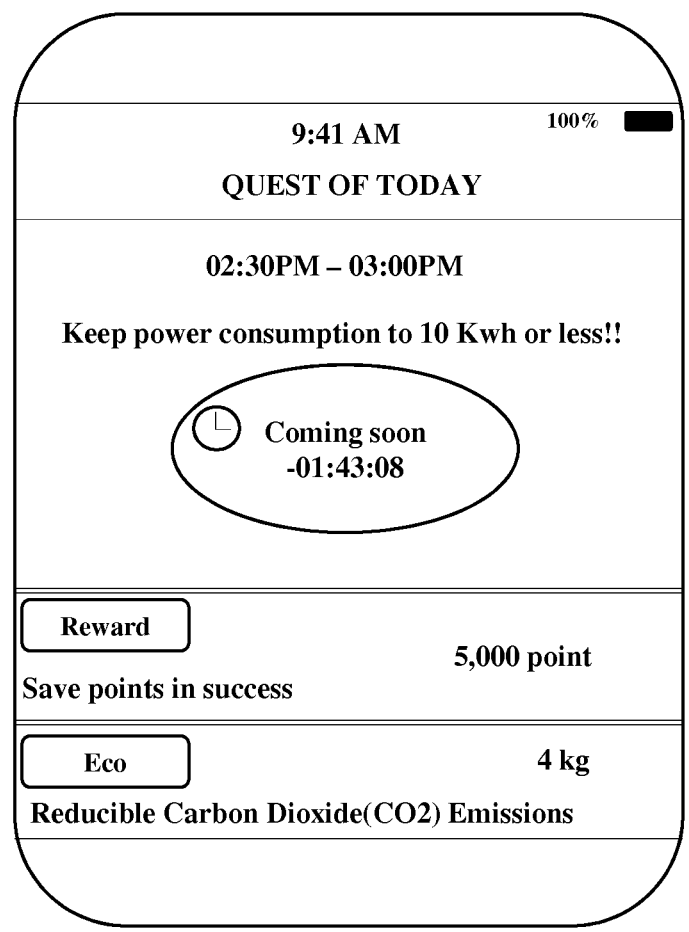
FIGS. 5A and 5B illustrate a screen that outputs guidance information, according to an embodiment as disclosed herein.
Figure 5B:
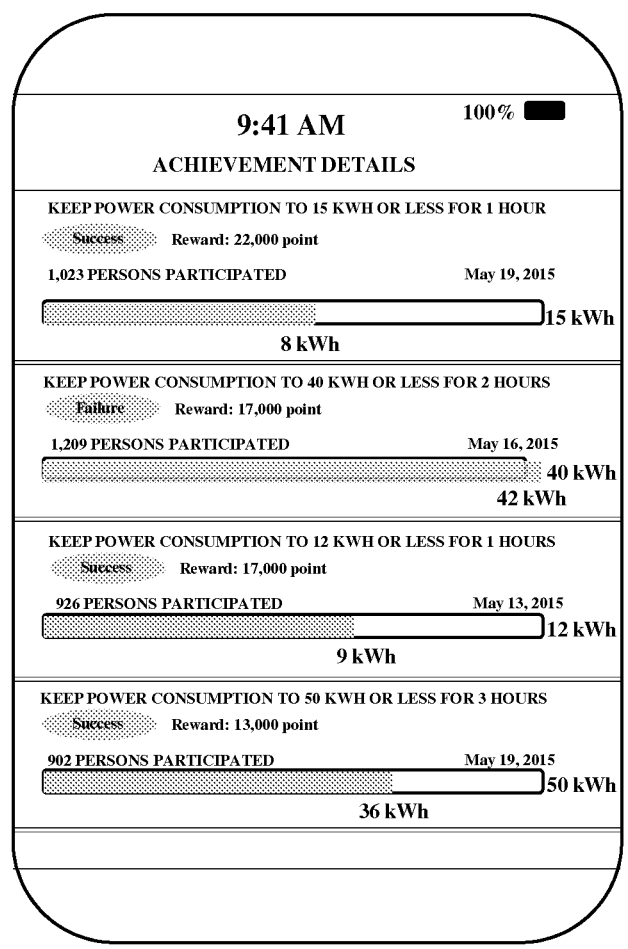

FIGS. 5A and 5B illustrate a screen that outputs guidance information for power consumption reduction according to the embodiment of the present invention. Herein, it is assumed that the guidance information may be output when executing the power related application.

FIGS. 5A and 5B illustrate a screen that outputs guidance information, according to an embodiment as disclosed herein. According to the FIG. 5A, the communicating device 106 may display a screen including a time period (2:30 P.M. to 3:00 P.M.) in which the power usage reduction is required and anticipated compensation information (saving saved money of 5,000 points) depending on the power usage reduction as the guidance information.

According to the FIG. 5B, the communicating device 106 displays a statement list which the subscriber achieves according to the guidance information of the power consumption reduction and the amount of compensation therefore to motivate the user to more positively participate in reducing the power consumption.

Figure 6:
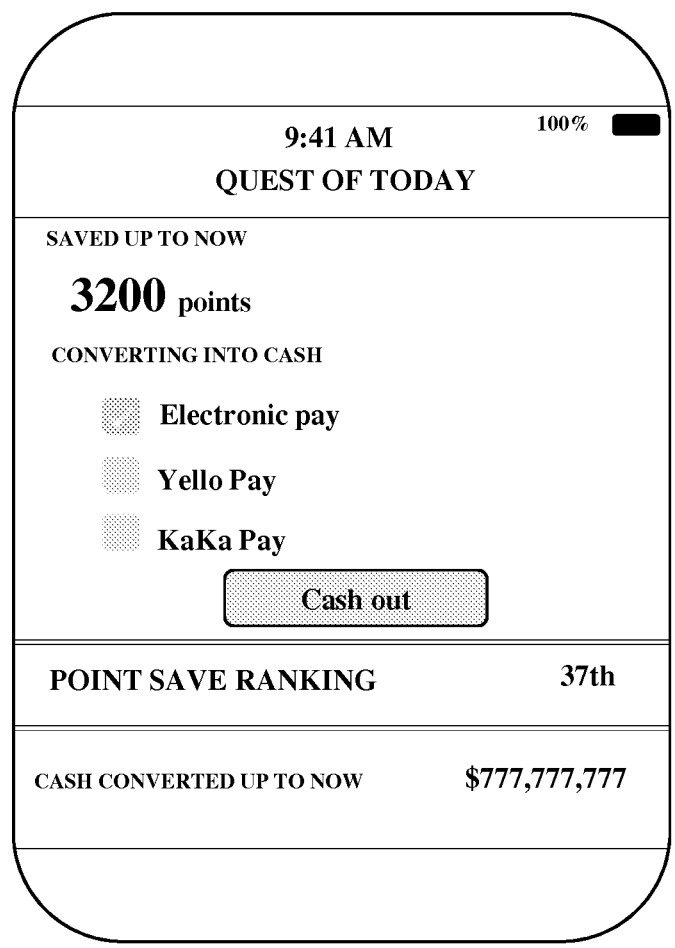
FIG. 6 illustrates a screen that outputs compensation information, according to an embodiment as disclosed herein.

FIG. 6 illustrates a screen that outputs compensation information for power usage reduction, according to an embodiment as disclosed herein. It is assumed that the compensation information may be output when executing the power related application. According to the FIG. 6, when the communicating device 106 acquires points (hereinafter, referred to as compensation points) usable for paying the power consumption fee to correspond to the power usage reduction, the communicating device 106 may display the acquired compensation point (e.g., 3200 points) and present a method that can encash the acquired compensation point. Furthermore, the communicating device 106 may display a total amount (e.g., 777,777,777 won) acquired by converting the compensation point into the cash and a ranking (e.g., 37th) of a subscriber of the communicating device 106 among all the subscribers.

Hereinafter, referring to the FIGS. 7 to 10, an energy measuring apparatus at a penetration point of power and a labeling server 700 generating power information by labeling a data set received therefrom, according to an embodiment of the present invention will be described.

Figure 7:
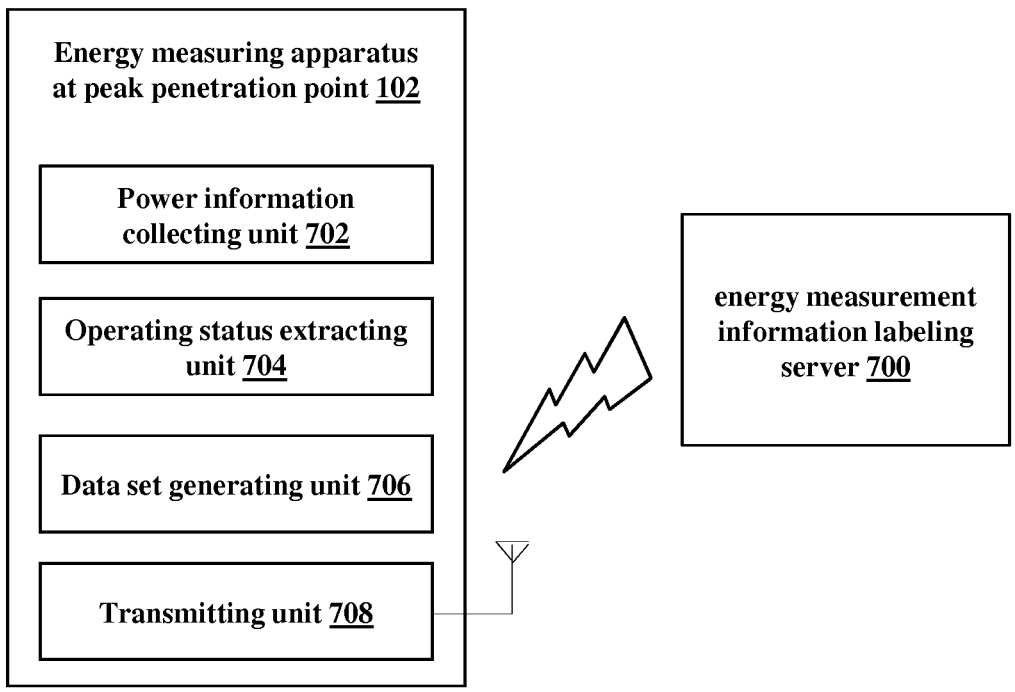
FIG. 7 is a block diagram illustrating an energy measuring apparatus at a power penetration point, according to an embodiment as disclosed herein.

FIG. 7 is a block diagram illustrating an energy measuring apparatus 102 at a power penetration point, according to an embodiment as disclosed herein. In the embodiment, the energy measuring apparatus 102 can be configured to generate an unregistered load clustering data set in order to individually estimate energy consumption information of each load apparatus connected to the power penetration point and transmits the estimated energy consumption information to an energy measurement information labeling server 700.

The energy measuring apparatus 102 described herein is installed together with a single sensor at the power penetration point. The energy measuring apparatus 102 performs a series of operations to measure total electric energy consumption and estimate energy consumption of each load apparatus. Unlike the conventional systems and methods, a previous information processing process performed for each load apparatus is summarized below.

First, a snapshot is extracted from a signal of voltage or current. Noise filtering is performed by extracting a reference point. Normal or excessive statuses of the voltage, active power, reactive power, or the like are distinguished based on a corresponding result, and operating statuses. An operating status change such as an on or off event of the individual load apparatuses are extracted through the distinguished normal or excessive statuses. In addition, a final clustering data set is generated by pattern matching load classification through a voltage-current correlation, a high-frequency distortion, a current or power snapshot signal deformation, an active or reactive power correlation, or the like associated with a load feature. Further, the generated clustering data set is transmitted to the energy measurement information labeling server 700 or cloud through data compression in an unregistered status. For example, load classification mark such as 1, 2, 3 or A, B, C, or the like may not be a registered status and may not be recognized to a user.

The energy measuring apparatus 102 can include a power information collecting unit 702, an operating status extracting unit 704, a data set generating unit 706, and a transmitting unit 708.

In an embodiment, the power information collecting unit 702 can be configured to collect energy or power information including a power signal at the power penetration point for a plurality of load apparatuses. The load apparatus described herein can include energy using apparatuses or components using electric energy. In an embodiment, the load apparatus can include both the individual energy apparatus such as television, refrigerator, or the like and the component unit such as motor, light, or the like. The power penetration point can be, for example, a node into which power penetrates with respect to the plurality of load apparatuses such as the power penetration point of a panel board or a distribution board of a household. Further, the various operations performed by the power information collecting unit 702 are described in detail in conjunction with the FIG. 8a.

In an embodiment, the operating status extracting unit 704 can be configured to distinguish between a normal or excessive status of a power change from the collected voltage or power information to extract an operating status or a change pattern of the operating status of the load apparatus. Further, the various operations performed by the operating status extracting unit 704 are described in detail in conjunction with the FIG. 8b.

In an embodiment, the data set generating unit 706 can be configured to generate a data set for each of the individual load apparatuses which matches the operating status or the change pattern of the operating status through a signal correlation depending on power usage information of the individual load apparatuses. The various operations performed by the data set generating unit 706 are described in detail in conjunction with the FIG. 8c.

When the data sets are generated, the transmitting unit 708 can be configured to transmit the generated data sets to the energy measurement information labeling server 700 that generates labeled power information by recombining the data sets.

In an embodiment, the energy measuring apparatus 102, at the power penetration point, for load balancing between the energy measuring apparatus 102 and the server 104 is described. The power information collecting unit 702 is configured to collect power information at a snapshot extraction frequency. The snapshot extraction frequency described herein within a range of 10 to 900 per second. The operating status extracting unit 704 is configured to detect an operating status of at least one load apparatus at the snapshot extraction frequency. The operating status described herein is one of a steady state and a transient state. Further, the data set generating unit 706 is configured to generate a representative snapshot of the power information, when the normal status is detected. The data set generating unit 706 is configured to generate a plurality of snapshots of the power information, when the transient state is detected. Furthermore, the transmitting unit 708 is configured to transmit the representative snapshot of the power information, when the normal status is detected; and transmit all the snapshots of the power information, when the transient state is detected. Furthermore, the various operations performed for load management between the server 104 and the energy measuring apparatus 102 is described in conjunction with the FIG. 9.

The FIG. 7 illustrates a limited overview of the energy measuring apparatus 102 but, it is to be understood that other embodiments are not limited thereto. The labels provided to each unit or component is only for illustrative purpose and does not limit the scope of the invention. Further, the one or more modules can be combined or separated to perform the similar or substantially similar functionalities without departing from the scope of the invention. Furthermore, the energy measuring apparatus 102 can include various other components interacting locally or remotely along with other hardware or software components to measure energy usage information of a plurality of load apparatus connected to a power penetration point. For example, the component can be, but is not limited to, a process running in the controller or processor, an object, an executable process, a thread of execution, a program, or a computer.

Figure 8A:
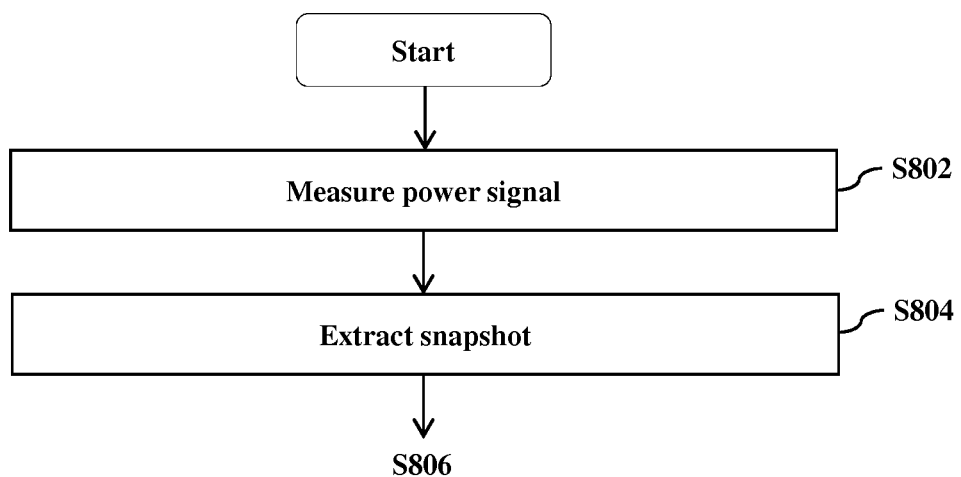
FIGS. 8a, 8b, and 8c are flowcharts illustrating various operations of each component of the energy measuring apparatus at a power penetration point, according to an embodiment as disclosed herein.

FIG. 8a is a flowchart illustrating various operations performed by the power information collecting unit 702 of the energy measuring apparatus 102 at a power penetration point, according to the embodiments as described herein. In the embodiment, the power information collecting unit 702 can be configured to measure a power signal (Step S802). Unprocessed power information waveforms of the current and the voltage are measured through the energy measuring apparatus 102 installed at the power penetration point and the single sensor.

Further, the power information collecting unit 702 can be configured to extract snapshot (Step S804). A voltage or current snapshot of an AC waveform having a predetermined cycle is collected. In the embodiment, snapshots of voltage having one AC cycle waveform and high-frequency current are preferably extracted.

Figure 8B:
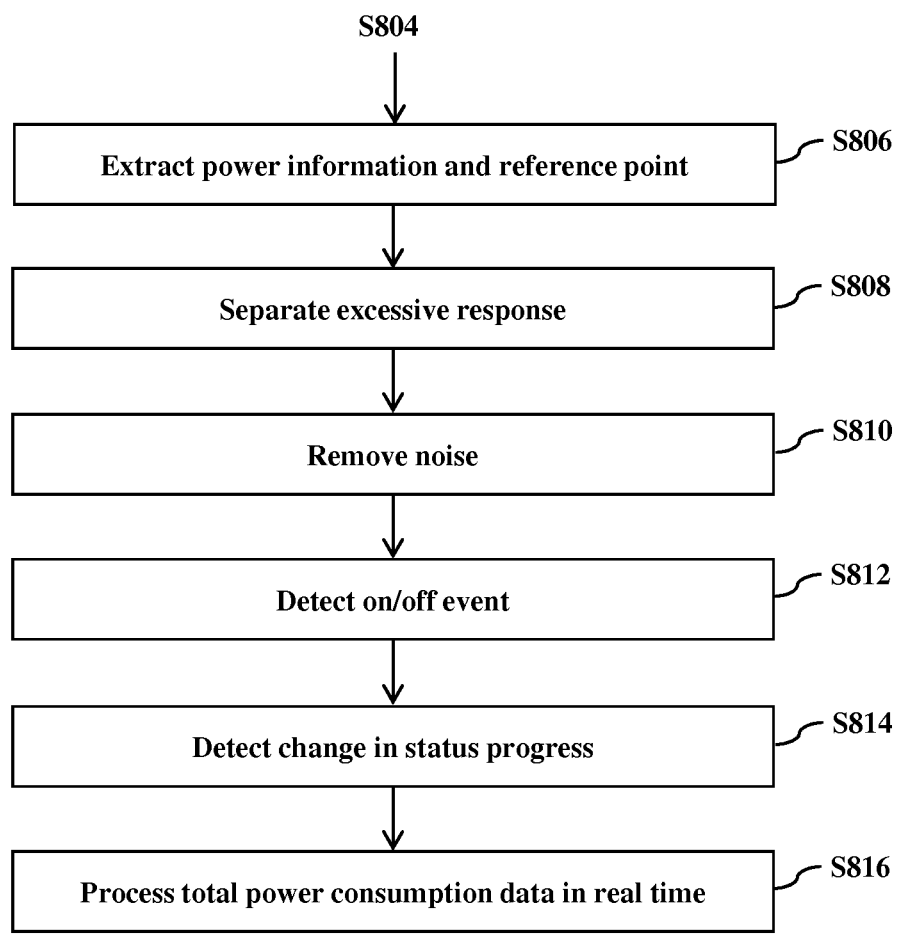

FIG. 8b is a flowchart illustrating various operations performed by the operating status extracting unit 704 of the energy measuring apparatus 102 at a power penetration point, according to the embodiments as described herein. The operating status extracting unit 704 can be configured to distinguish between a normal or excessive status of a power change from the collected voltage or power information to extract an operating status or a change pattern of the operating status of the load apparatus.

Referring to the FIG. 8b, the operating status extracting unit 704 can be configured to extract power information and reference point (Step S806). In an embodiment, real-time power consumption and power quality information are extracted, and the reference point for distinguishing the normal or excessive status is extracted.

In the embodiment, the reference point is preferably power consumption which is constantly used without fluctuation while being not turned on or off and continuously turned on in each of the load apparatuses through the extraction of the real-time power consumption and power quality information.

Further, the operating status extracting unit 704 can be configured to separate an excessive response (Step S808). In an embodiment, an excessive status interval is extracted, in which turn-on or off is performed or the operating status is changed by operations of the individual load apparatuses in the power consumption.

Furthermore, in an embodiment, the operating status extracting unit 704 can be configured to remove a noise (Step S810). A meaningless high-frequency noise signal generated in power signal measurement of total power consumption is removed.

Furthermore, the operating status extracting unit 704 can be configured to classify the snapshot according to the extracted operating status or change pattern of the operating status. For example, in the case of being determined as the excessive response operation, the snapshot may have an even higher snapshot extraction frequency than the normal status.

Furthermore, the operating status extracting unit 704 can be configured to detect an on or off event (Step S812). In an embodiment, the snapshots for events are classified for each on or off status before clustering each of the individual load apparatuses through detection of the on or off event. The operating status extracting unit 704 can be configured to detect status change (Step S814). Multi-steps other than the on or off operation are provided. The change patterns of the operating statuses of loads which have a continuous change characteristic are detected and classified.

After detecting the status change, the operating status extracting unit 704 can be configured to process real-time total power consumption data (Step S816). In an embodiment, the power information data is operated and stored, and a transmission data packet is generated with respect to total energy consumption and the power quality information for a real-time power consumption service.

Figure 8C:
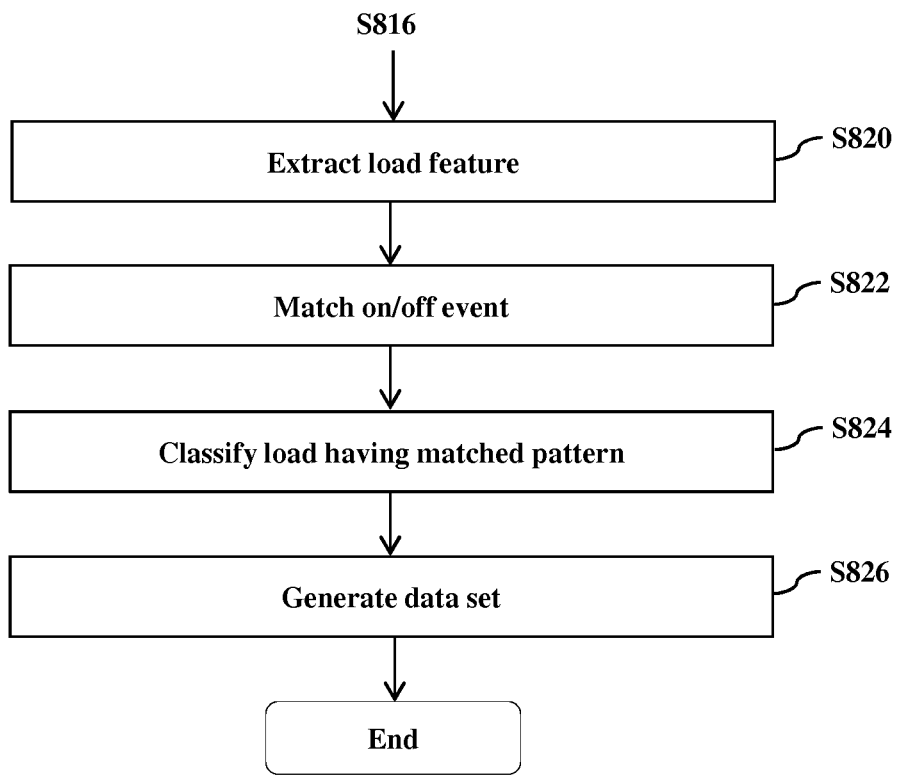

FIG. 8c is a flowchart illustrating various operations performed by the data set generating unit 706 of the energy measuring apparatus 102 at a power penetration point, according to the embodiments as described herein. The data set generating unit 706 can be configured to generate a data set for each of the individual load apparatuses which matches the operating status or the change pattern of the operating status through a signal correlation depending on power usage information of the individual load apparatuses.

Referring to the FIG. 8c, the data set generating unit 706 extracts load features (Step S820). In the embodiment, a signal correlation, on which the power usage features of the individual load apparatuses are reflected, is generated by using the snapshot, the excessive response, the on or off event, and the status change information extracted from the total power consumption data. The signal correlation can include the voltage or current correlation, the high-frequency distortion, the current or power signal deformation, the active or reactive power correlation, or the like.

Further, the data set generating unit 706 can be configured to match the on or off event (Step S822), and classify pattern matching load (Step S824) to generate the data set. The on or off operation events for the individual load apparatuses are classified in a pair of the same load apparatuses based on the generated signal correlation. The multi-steps or continuous change characteristics are classified into an association group with the on or off operation events with respect to the same load apparatus based on the generated signal correlation.

Furthermore, the data set generating unit 706 can be configured to generate a data set (Step S826). The data sets collected by the association group are generated through the on or off event matching and the pattern matching load classification.

When the data sets are generated, the transmitting unit 708 can be configured to transmit the generated data sets to the energy measurement information labeling server 700 that generates labeled power information by recombining the data sets.

Prior to the transmission, in the embodiment, the data packet generated by the energy measuring apparatus 102 is compressed to facilitate transmission of the massive data to the energy measurement information labeling server 700.

Further, the power consumption and the quality information data required to perform a real-time power energy information service can be together transmitted.

Further, referring to the FIGS. 8a to 8c, a snapshot extraction (that is, power signal sampling) period and the resulting information processing efficiency of the present invention will be described in detail.

In an embodiment, it is important for the power information collecting unit 702 to appropriately select the snapshot extraction frequency. When a snapshot extraction frequency is lower than a specific value, for example, when the snapshot extraction frequency is less than once per second, a resolution for a transient state interval of the load apparatus is low. As a result, it is difficult to distinguish different individual load apparatuses. When the snapshot extraction frequency is higher than a specific value, for example, when the snapshot extraction frequency is higher than thousands to ten thousand times per second, the resolution for the transient state interval is excessively high. As a result, an error may occur, such as recognizing the same load apparatuses as different load apparatuses. Therefore, the snapshot extraction frequency for efficient prior information processing of the energy measuring apparatus at the penetration point of power is appropriately 10 to 900 times per second.

Further, information processing after extracting the operating state may be efficient through the snapshot classification of the operating status extracting unit 704 (e.g., a method in which, in the snapshot extraction step (S804), the snapshot is continuously extracted at 15 times per second. But when there is no change in operating status, only one snapshot among 15 snapshots or a representative value is selected and classified. When the change in operating status is sensed, all of the 15 snapshots are selected to separately increase only the resolution of the transient state interval). That is, by a method in which while the resolution of the transient state interval (which is required for the energy usage information analysis) for each apparatus increases, a data traffic related burden decreases (e.g., even in the case where the transmitting unit 708 periodically transmits data once per second, when there is no change in operating status, only one snapshot which is selected and classified, or the representative value calculated through mensuration of division is transmitted. During the transient state interval, 15 snapshots are transmitted at once). Whole system's capability of load balancing between the energy measuring apparatus 102 and the server 104 is improved. As a result, the on or off event detecting step (S812), the stats change detecting step (S814), and some or all the steps performed by the data set generating unit 706 may be performed through the server 104.

Figure 10:
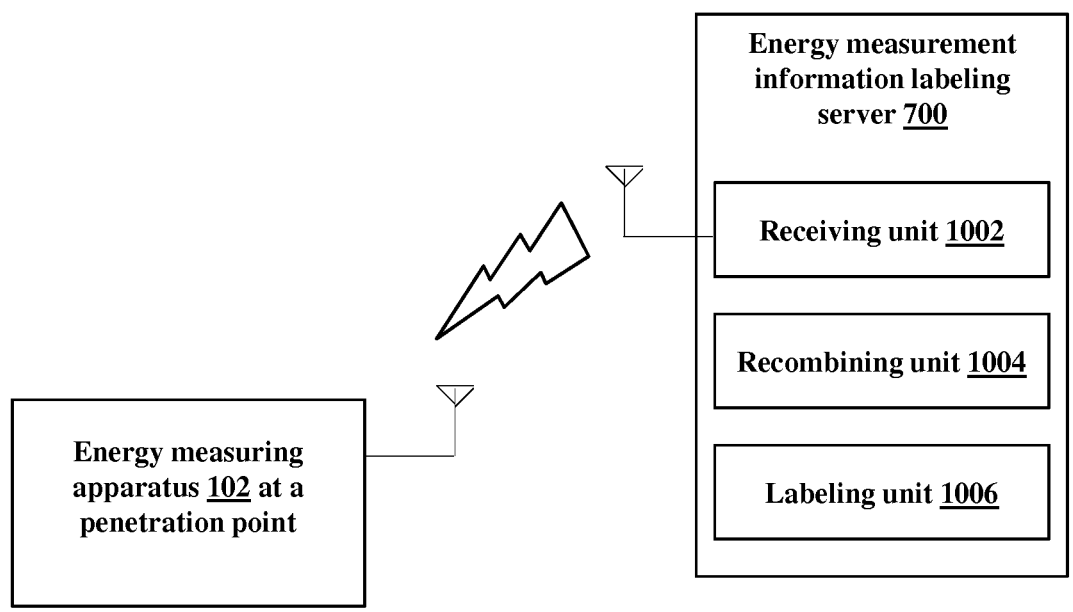
FIG. 10 is a block diagram illustrating a labeling server, according to an embodiment as disclosed herein.

The details of the energy measurement information labeling server 700 that generates the labeled power information by receiving the data sets generated by the power penetration point energy measuring apparatus 102 are described in conjunction with the FIG. 10.

The various actions, acts, blocks, steps, or the like of the FIG. 8 may be performed in the order presented, in a different order or simultaneously. Further, in some embodiments, some of the actions, acts, blocks, steps, or the like may be omitted, added, modified, skipped, or the like without departing from scope of the invention.

Figure 9A:
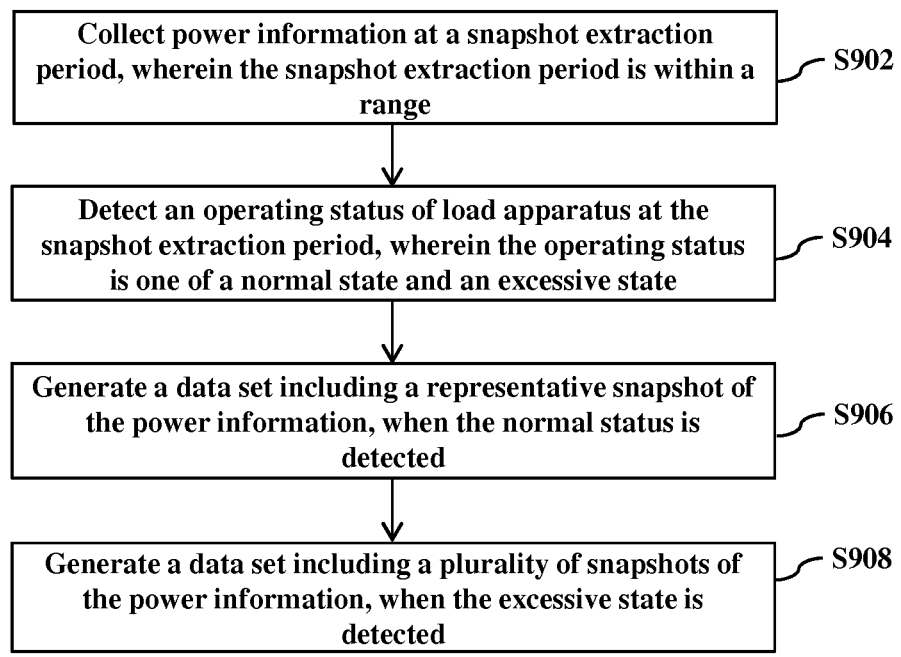
FIG. 9a is a flow chart illustrating various operations performed by the energy measuring apparatus for load management between the energy measuring apparatus and the server, according to an embodiment as disclosed herein.

FIG. 9a is a flow chart illustrating various operations performed by the energy measuring apparatus 102 for load management between the energy measuring apparatus 102 and the server 104, according to an embodiment as disclosed herein. At S902, the method includes collecting power information at a snapshot extraction frequency, wherein the snapshot extraction frequency is within a range. In an embodiment, the range described herein is within 10 to 900 times per second. Unlike the conventional systems and methods, an appropriate snapshot extraction frequency selected for the efficient prior information processing of the energy measuring apparatus at the penetration point of power. For example, when the snapshot extraction frequency is lower than a specific value, for example, when the snapshot extraction frequency is less than once per second, a resolution for a transient state interval of the load apparatus is low. As a result, it is difficult to distinguish different individual load apparatuses. When the snapshot extraction frequency is higher than a specific value, for example, when the snapshot extraction frequency is higher than thousands to ten thousand times per second, the resolution for the transient state interval is excessively high. As a result, an error may occur, such as recognizing the same load apparatuses as different load apparatuses. Therefore, the snapshot extraction frequency for efficient prior information processing of the energy measuring apparatus at the penetration point of power is appropriately 10 to 900 times per second.

At S904, the method includes detecting an operating status of load apparatus at the snapshot extraction frequency. In an embodiment, the operating status described herein is one of a steady state and a transient state. At S906, the method includes generating a data set including a representative snapshot of the power information, when the normal status is detected; and generating a data set including a plurality of snapshots of the power information, when the transient state is detected as shown at S908. For example, the snapshot is continuously extracted at 15 times per second. But when there is no change in operating status, only one snapshot among 15 snapshots or a representative value is selected and classified. When the change in operating status is sensed, all of the 15 snapshots are selected to separately increase only the resolution of the transient state interval). Unlike the conventional systems and methods, the snapshot is selected based on a mensuration method. That is, by a method in which while the resolution of the transient state interval (which is required for the energy usage information analysis) for each apparatus increases, a data traffic related burden decreases (e.g., even in the case where the transmitting unit 708 periodically transmits data once per second, when there is no change in operating status, only one snapshot which is selected and classified, or a representative value calculated through mensuration of division is transmitted. During the transient state interval, 15 snapshots are transmitted at once). Whole system's capability of load balancing between the energy measuring apparatus 102 and the server 104 is improved. As a result, the on or off event detecting step (S812), the stats change detecting step (S814), and some or all the steps performed by the data set generating unit 706 may be performed through the server 104 as described in the FIG. 9b.

Figure 9B:
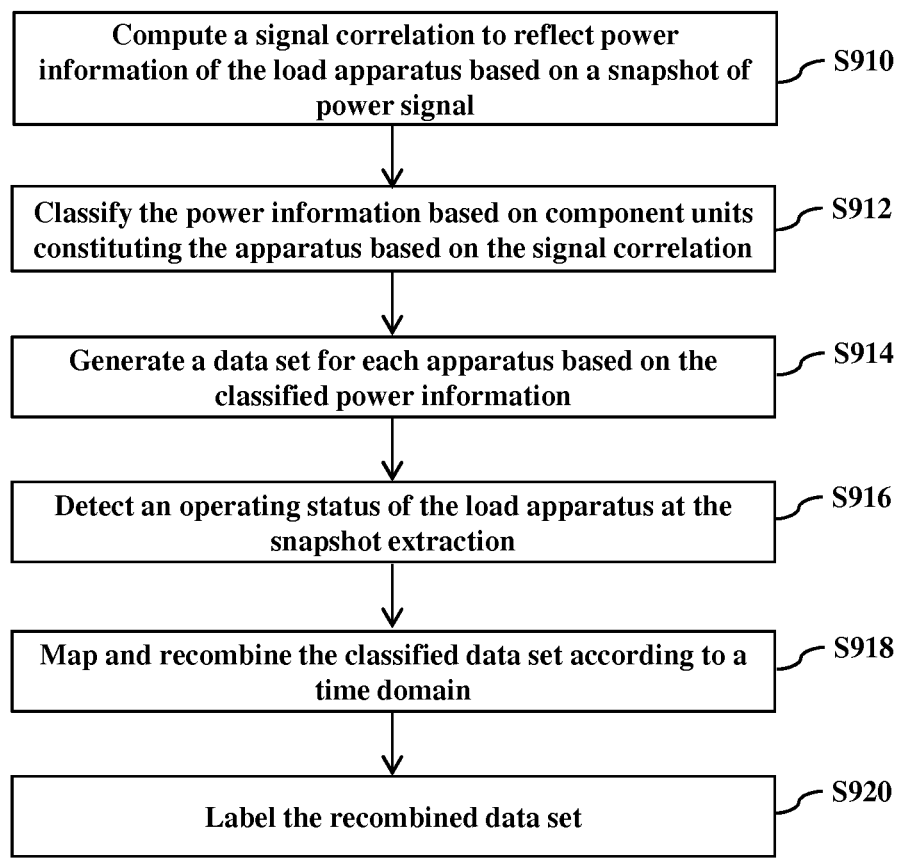
FIG. 9b is a flow chart illustrating various operations performed by the server for load management between the energy measuring apparatus and the server, according to an embodiment as disclosed herein.

FIG. 9b is a flow chart illustrating various operations performed by the server 104 for load management between the energy measuring apparatus 102 and the server 104, according to an embodiment as disclosed herein. At S910, the method includes computing a signal correlation to reflect power information of the load apparatus based on a snapshot of power signal. In an embodiment, the method allows the server 104 to compute the signal correlation to reflect power information of the load apparatus based on the snapshot of the power signal. The signal correlation described herein includes at least one of voltage correlation, current correlation, high-frequency distortion, power signal deformation, active power correlation, and reactive power correlation. The snapshot of the power signal described herein is related to one of a voltage snapshot and a current snapshot of a waveform having a predetermined cycle measured at a distant energy measuring apparatus.

At S912, the method includes classifying the power information based on component units constituting the apparatus 104 based on the signal correlation. In an embodiment, the method allows the server 104 to match the on or off event and classify pattern matching load to generate the data set. The on or off operation events for the individual load apparatuses are classified in a pair of the same load apparatuses based on the generated signal correlation. The multi-steps or continuous change operation are classified into an association group with the on operation or off operation events with respect to the same load apparatus based on the generated signal correlation.

At S914, the method includes generating a data set for each apparatus based on the classified power information. In an embodiment, the data sets collected by the association group are generated through the on or off event matching and the pattern matching load classification.

At S916, the method may include detecting an operating status of the load apparatus at the snapshot extraction. The method allows the server 104 detect the operating status of the load apparatus at the snapshot extraction. A distribution plane is distinguished according to load operating characteristics (on or off, multi-steps, a continuous change, always activation, or the like) for the individual load apparatuses determined as the same energy load apparatus.

At S918, the method includes mapping and recombining the classified data set according to a time domain. In an embodiment, the method allows the server 104 to map and recombine the classified data set according to the time domain. At S920, the method includes labeling the recombined data sets.

The various actions, acts, blocks, steps, or the like of the FIG. 9 may be performed in the order presented, in a different order or simultaneously. For example, the step of generating a data set at S914 may comprise the step of mapping and recombining the classified data set at S918 and the step of labeling the recombined data set at S920. Further, in some embodiments, some of the actions, acts, blocks, steps, or the like may be omitted, added, modified, skipped, or the like without departing from scope of the invention.

The FIG. 10 is a block diagram illustrating the energy measurement information labeling server 700, according to the embodiments as described herein. In an embodiment, the energy measurement information labeling server 700 can be configured to process the energy usage information and saving tip consulting for a power user at the power penetration point through processes such as machine running and automatic labeling based on the received clustering data set and real-time power consumption, and power quality information data set. The energy measurement information labeling server 700 may be a mass data processing device that processes the total energy information and energy information for each of the individual load apparatuses to generate various energy saving solutions.

In an embodiment, the energy measurement information labeling server 700 can be configured to process specific post information through the various computer operations. The process classifies the unregistered load clustering data set into multi-dimensional planes based on the reference area, such as the active power, the reactive power, the time, or the like. The process sets a classification boundary surface in the same load apparatus through the machine running to distinguish the unregistered load clustering set for each specific operation or component such as on or off, multi-steps, continuous change, always-activation, or the like.

The distinguished data sets are mapped to the real-time power consumption change to complete the distinguishment and the lower components of the individual load apparatuses are grouped into the same load apparatus which may be recognized by the user (1+2+3 or A+B+C). Further, the registered data sets (refrigerator, washing machine, air-conditioner, or the like) of the individual load apparatuses are matched which have been already stored to be automatically labeled.

In this case, the load apparatuses which are not automatically labeled due to data which are present in the registered data sets are manually labeled through a means of checking the corresponding time by manually turning on or off the load apparatuses which are not automatically labeled. In addition, the manually generated data are added to the pre-collected data set again and then used for the automatic labeling. Further, the various components of the energy measurement information labeling server 700 and operations thereof are described in conjunction with the FIG. 11.

Referring to the FIG. 10, in an embodiment, the energy measurement information labeling server 700 can include a receiving unit 1002, a recombining unit 1004, and a labeling unit 1006.

The receiving unit 1002 can be configured to receive a data set generated by classifying power information based on individual load apparatuses. The recombining unit 1004 can be configured to classify the received data set on a multidimensional plane according to operating characteristics of the individual load apparatuses. Further, the recombining unit 1004 can be configured to map and recombine the classified data set according to a time domain.

Prior to this, the recombining unit 1004 can be configured to decompress data. When the energy measuring apparatus 102 transmits the compressed data, the energy measuring apparatus 102 can cancel the data compression in order to increase the execution speed. When the compression is cancelled, the recombining unit 1004 can be configured to map the classified data to a power consumption change in the time domain to recombine components in the same load apparatus.

The FIG. 10 illustrates a limited overview of the energy measurement information labeling server 700 but, it is to be understood that other embodiments are not limited thereto. The labels provided to each unit or component is only for illustrative purpose and does not limit the scope of the invention. Further, the one or more components can be combined or separated to perform the similar or substantially similar functionalities without departing from the scope of the invention. Furthermore, the energy measurement information labeling server 700 can include various other components interacting locally or remotely along with other hardware or software components to label the extracted energy usage information of a plurality of load apparatus connected to a power penetration point. For example, the component can be, but is not limited to, a process running in the controller or processor, an object, an executable process, a thread of execution, a program, or a computer.

Figure 11:
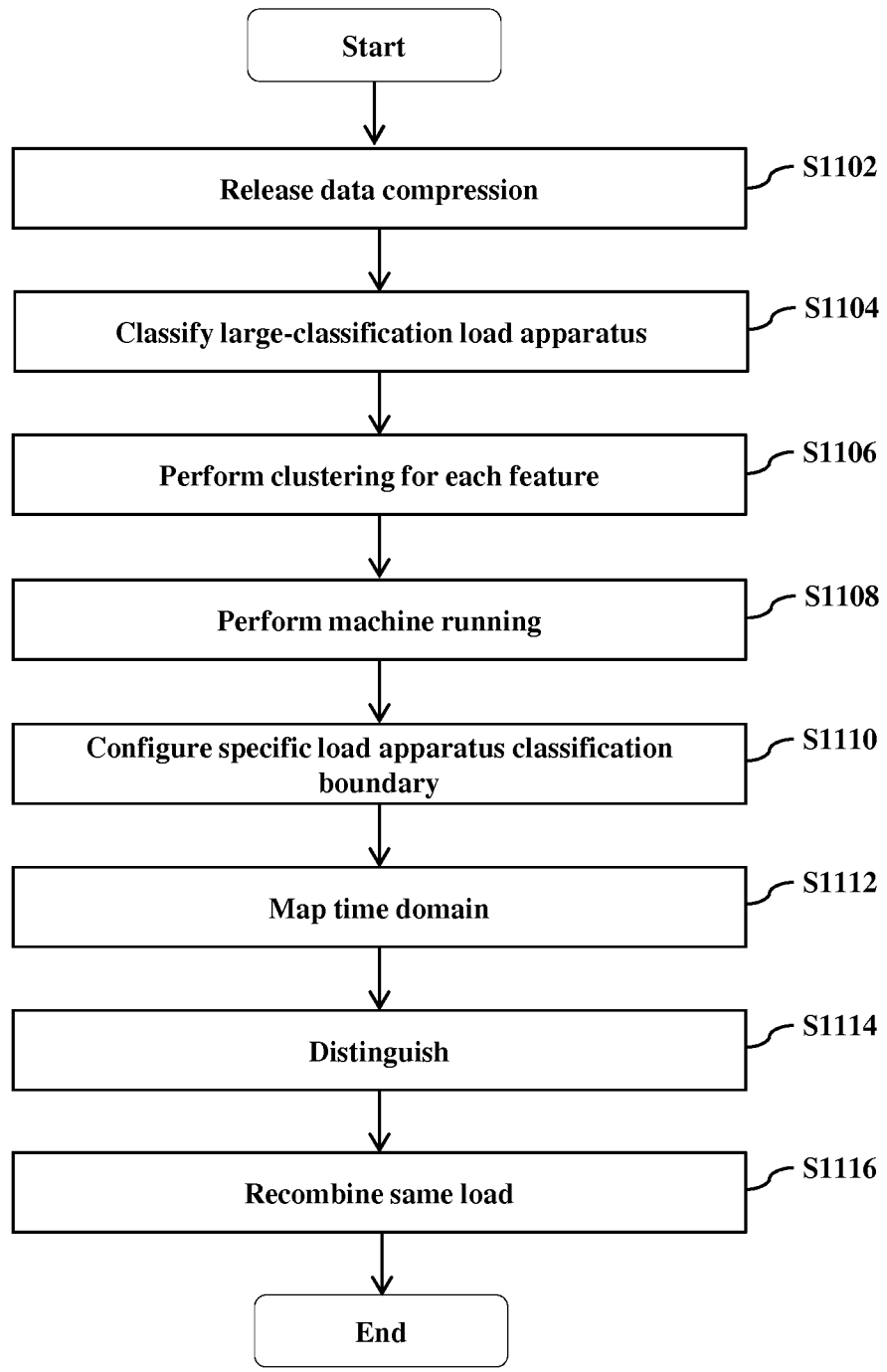
FIG. 11 is a flowchart illustrating various operation of the labeling server, according to an embodiment as disclosed herein.

FIG. 11 is a flowchart illustrating various operations performed by the energy measurement information labeling server 700, according to the embodiments as described herein. In an embodiment, the recombining unit 1004 can be configured to decompress data (Step S1102). When the energy measuring apparatus 102 transmits the compressed data, the energy measuring apparatus 102 can cancel the data compression in order to increase the execution speed. The recombining unit 1004 can be configured to classify large classification load apparatus (Step S1104). A distribution plane is distinguished according to load operating characteristics (on or off, multi-steps, a continuous change, and always activation) for the individual load apparatuses determined as the same energy load apparatus.

Further, the recombining unit 1004 can be configured to perform clustering of features (Step S1106). The multi-dimensional plane is reconfigured so as to facilitate setting a boundary in the distribution plane by interlocking a clustering data set. In an embodiment, the active power, the reactive power, a time, or the like can be reference areas in reconfiguring the multi-dimensional plane.

When the multi-dimensional plane is reconfigured, the recombining unit 1004 can be configured to perform machine learning (Step S1108). The operations of the individual load apparatuses or an inter-component boundary classification reference is generated by using a clustering result for each load apparatus and a machine running method based on a status distinguishment technique such as an artificial intelligence network. In addition, the recombining unit 1004 can be configured to set specific load apparatus classification boundary (Step S1110). Data are classified by performing load distinguishment at an individual component level for clustering data by using the machine running boundary classification reference. In this case, unregistered-scheme detailed load classification is determined up to component levels for the individual load apparatuses from a total electric energy.

Further, the recombining unit 1004 can be configured to map time domain (Step S1112). The data sets for unregistered components classified in the process are mapped to real-time data in the time domain. The recombining unit 1004 can be configured to distinguish the mapped data (Step S1114). The mapped data are distinguished at the component level by various colors or a display method which may be recognized by the user.

Furthermore, the recombining unit 1004 can be configured to recombine the same load (Step S1116). A group is generated for the load apparatus which may be recognized by the user by combining sub components in the individual load apparatuses generated in the distinguishing step. As one example, compressor, motor, lamp, and control circuit characteristics, generated in the distinguishing step, are combined to be grouped into a refrigerator.

After the recombination step, the labeling unit 1006 can be configured to label the recombined data set. For example, a name of a corresponding load apparatus automatically matches unregistered temporary mark data classified as the individual load apparatuses in association with a prestored load apparatus data set. As one example, the A, B, C, or the like may be automatically registered as a refrigerator, a television, a washing machine, or the like through a data pattern and a matching technique with storage data.

Further, in the embodiment, labeling may be manually received. In spite of execution of automatic labeling, a developer or the user manually names apparatuses with respect to loads which are unregistered due to mismatching with prestored load apparatus data and inputs the names. A method that uses an on or off time of the apparatus is also available.

Further, the corresponding data are separately stored together with registration with respect to the individual load apparatuses in which the manual labeling is performed to extend a prestored load apparatus data set.

Furthermore, the energy measurement information labeling server 700 may provide data analysis information using energy usage information of the individual load apparatuses. The data analysis based on a behavioristic psychology analysis technique may be applied to total power and energy usage patterns of the individual load apparatuses to generate a specific data set.

Further, a specialist consulting tip to induce energy saving of the user may be automatically generated through the data analysis.

Moreover, an integrated service is available, which provides the total electric energy, usages of the individual load apparatuses, energy saving consulting, or the like to a specific building and a unit household through an energy IT special provider.

Example of various energy saving consulting can be, when a change of the clustering data set distinguished at the component level is sensed in association with the statuses of the individual load apparatuses to determine component aging statuses or failure statuses of the individual load apparatuses, to provide the determined component aging statuses or failure statuses to the user.

According to the embodiments, the hardware of the meter and the software techniques on the server are combined to extract energy usage information about individual components of various load apparatuses from total energy usage information at the power penetration point.

Further, since the software technique of the server is flexibly combined with the single energy measuring apparatus, detailed and accurate energy usage information of the individual load apparatuses is extracted without large cost for system installation through multiple apparatuses to derive a high-end energy saving scheme. In particular, it is possible to acquire energy usage information higher than a branch circuit level without adopting multiple sensors in the distribution board.

In summary, in the present invention, in extracting the energy usage information of the individual load apparatuses in the total electric energy consumption measured at the power penetration point, a specific server does not perform all techniques. Unlike the conventional mechanisms, the previous information processing is performed so as to have resolution which may be distinguished for each component in the single energy measuring apparatus and the server concentratively performs data storage, pattern analysis, and data utilization as an advantage thereof to secure flexibility in energy usage associated mass data processing, storing, or management of various loads.

The various actions, acts, blocks, steps, or the like of the FIG. 11 may be performed in the order presented, in a different order or simultaneously. Further, in some embodiments, some of the actions, acts, blocks, steps, or the like may be omitted, added, modified, skipped, or the like without departing from the scope of the invention.

Figure 12:
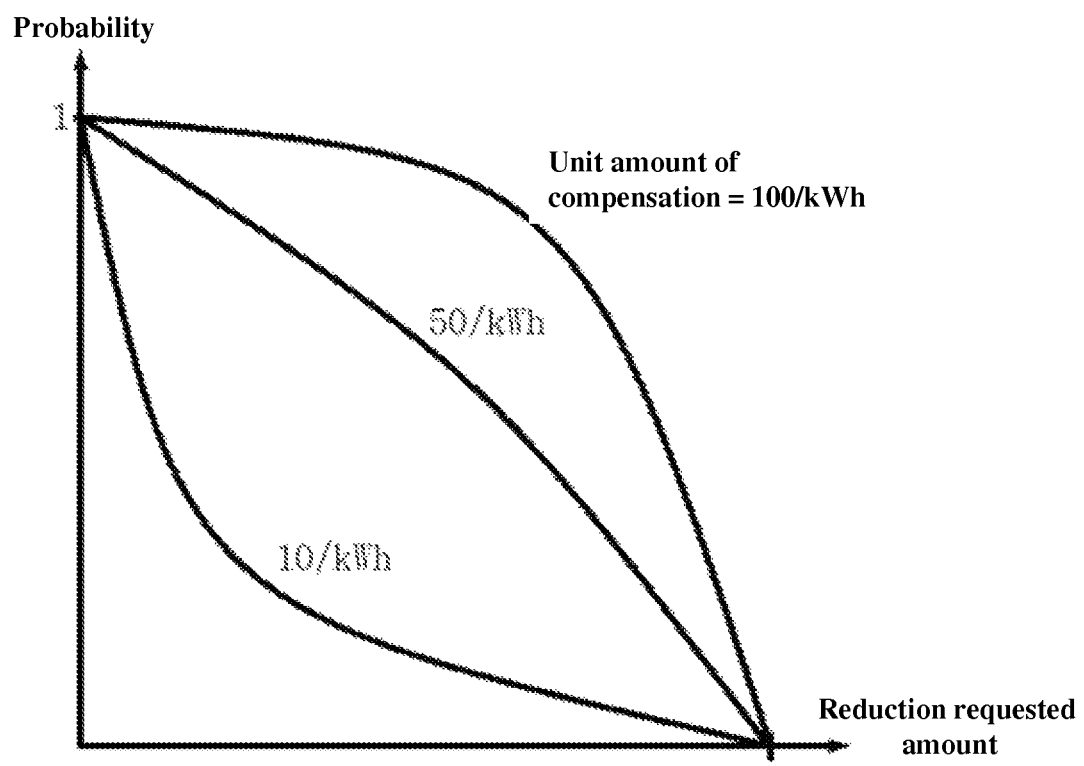
FIG. 12 is a graph illustrating a probability distribution of achieving reduction for a reduction request amount depending on the amount of compensation per different unit usage estimated for each subscriber, according to embodiments as described herein.

For example, FIG. 12 is a graph illustrating a probability distribution of achieving reduction for a reduction request amount depending on the amount of compensation per different unit usage estimated for each subscriber, according to embodiments as described herein. In the FIG. 12, a horizontal axis indicates a reduction request amount and a vertical axis indicates a probability of achieving the reduction request amount. The different curves shown in the FIG. 12 indicate different amounts of compensations per unit usage. The amount of compensation per unit usage may vary depending on a reduction request time because a power generation price varies due to a weather situation, power supply reservation rate, or the like.

Figure 13A:
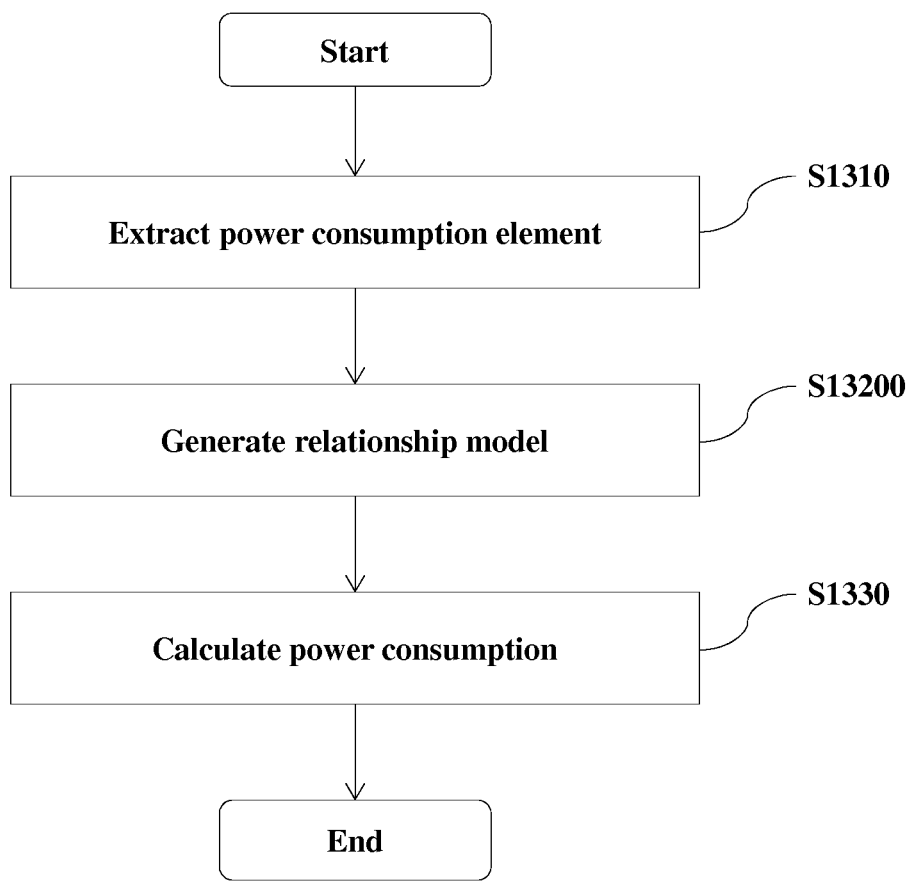
FIG. 13a is a flowchart illustrating a method for forecasting power consumption based on consumption characteristics, according to the embodiments as described herein.

FIG. 13a is a flowchart illustrating a method for forecasting power consumption based on consumption characteristics, according to the embodiments as described herein. In an embodiment, the method for forecasting power consumption, according to the exemplary embodiment includes a power consumption element extracting step (S1310), a relationship model generating step (S1320), and a power consumption calculating step (S1330).

In the power consumption element extracting step (S1310), the power consumption for each device is segmented per time to extract at least one power consumption element that influences the power consumption. The device described herein may be, for example, a feeder that supplies power or an apparatus consuming the power is segmented per time.

In an embodiment, the feeder which supplies the power to each electronic apparatus is configured below a power penetration point as illustrated in the FIG. 2 to supply the power. In general, there are many cases in which a purpose of use of the appliance is segmented per time for each feeder. Further, the appliance having the same purpose of use is connected to one feeder. For example, an air-conditioner, an indoor electric lamp, an electric heat device in an office, or the like may be used while being connected to different feeders.

In this case, in an embodiment, the power consumption may be power consumption of individual home appliances. The power consumption may be indirectly estimated from total power consumption except for the power consumption directly measured at a main power penetration point or a lower feeder.

The home appliance is a combination of detailed components required for operating the apparatus and the power consumption characteristics of the individual home appliances. Since the respective detailed components have unique energy consumption characteristics, the energy consumption characteristics based on an operation mode of the home appliance also have unique attributes. Therefore, in an embodiment, the energy consumption characteristics are sensed based on information on the directly measured energy consumption. Further, the energy consumption characteristics are compared with the home appliance's unique consumption characteristic information to indirectly extract the operating modes and the power consumption of the individual appliances.

When user purposes of the appliances are similar, consumption patterns are also comparatively similar. As a result, unlike the conventional systems and methods, real-time consumption of each device (such as the feeder and the apparatus which consumes the power) is performed.

That is, instead of forecasting the energy consumption only based on the energy consumption at the penetration point as illustrated in the FIG. 1, in the present invention, a collection unit of energy consumption data is miniaturized per home appliance or feeder. A forecast element for each home appliance or feeder is automated and extracted and thereafter, different forecast models are applied for each home appliance or feeder. In addition, values forecasted by the individual home appliances or feeders are summed up to calculate a total forecast value.

Figure 13B:
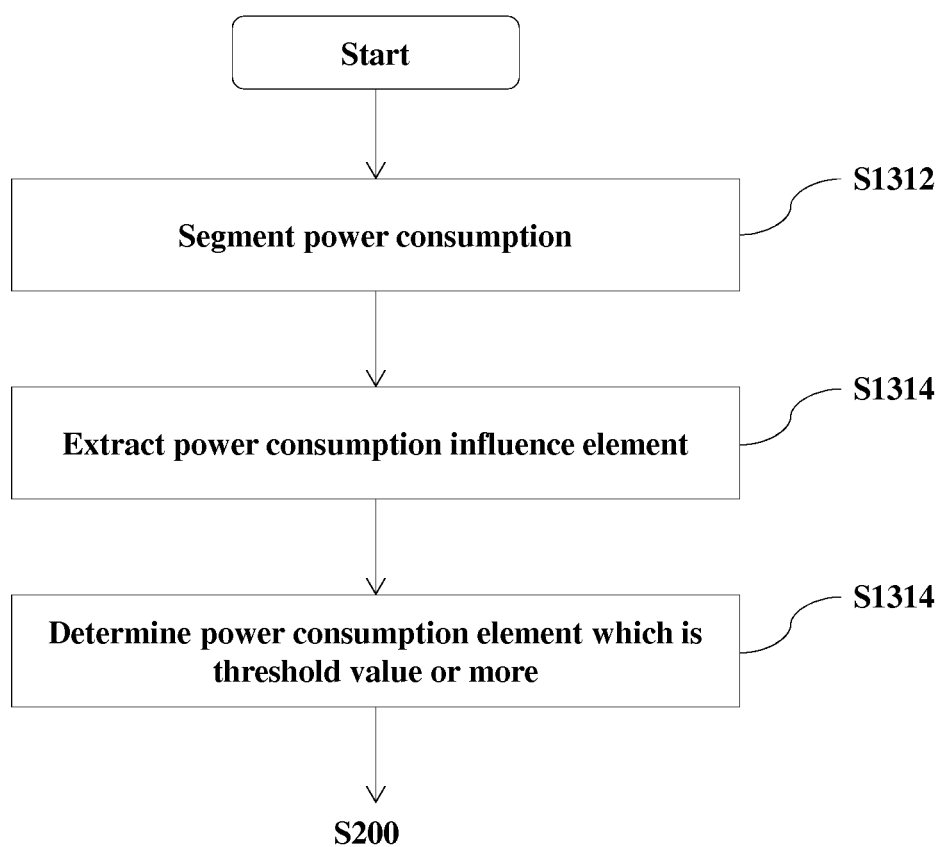
FIG. 13b is a flowchart illustrating various operations performed for extracting power consumption element to forecast the power consumption based on consumption characteristics, according to the embodiments as described herein.

FIG. 13b is a flowchart illustrating various operations performed for extracting power consumption element to forecast the power consumption based on consumption characteristics, according to the embodiments as described herein. In an embodiment, the power consumption element extracting step (S1310) includes a power consumption segmenting step (S1312), a power consumption element extracting step (S1314), and a threshold or more power consumption element determining step (S1316).

In an embodiment, in the power consumption segmenting step (S1312), the power consumption collected for each feeder or apparatus is segmented at a given time. That is, the power consumption is separated and collected for each home appliance or feeder in order to forecast the total power consumption. The power consumption collected and forecasted herein may be one or more of the apparent power consumption, idle power consumption, and reactive power consumption. Idle or reactive power, voltage, current, high-frequency power samples, or the like are collected to be used as an element to forecast. The collected power consumption is not limited to the arranged elements and may include various pieces of information associated with power consumption.

Further, the data collected for each home appliance or feeder are segmented at a given time again. Below Table 1 shows energy consumption for each feeder which is collected per hour, according to the embodiment described herein.

TABLE 1

| Serial No. | Feeder No. | Date | Hours | Power consumption (Wh) |
| --- | --- | --- | --- | --- |
| 1 | 1 | 2014 Feb. 1 | 00 | 1155.423 |
| 2 | 1 | 2014 Feb. 1 | 01 | 1000.329 |
| 3 | 1 | 2014 Feb. 1 | 02 | 1029.813 |
| 4 | 2 | 2014 Feb. 1 | 00 | 903.149 |
| 5 | 2 | 2014 Feb. 1 | 01 | 1051.256 |
| 6 | 2 | 2014 Feb. 1 | 02 | 1003.607 |
| 7 | 3 | 2014 Feb. 1 | 00 | 925.750 |
| 8 | 3 | 2014 Feb. 1 | 01 | 1012.230 |
| 9 | 3 | 2014 Feb. 1 | 02 | 1002.596 |

In an embodiment, the data collected for each feeder are segmented per time as an example, but the data may also be segmented per 30 minutes, 15 minutes, or the like for a more detailed forecast. Further, the segment unit may vary depending on the environment and the segmentation unit may vary for each time.

Further, in an embodiment, in the power consumption element extracting step (S1314), at least one power consumption element that influences the power consumption through the segmented power consumption is extracted.

The power consumption elements that influence the variation of the power consumption can include, for example, an indoor temperature, an outdoor temperature, humidity, a wind velocity, a sensory temperature, a minute dust degree, a $CO_2$ degree, minute dust, yellow dust, an ozone amount, an infectious disease, time, or the like. Apart from the above the power consumption elements, other examples of power consumption elements which may influence power consumption can include number of persons who resides in the house (which may be determined using a motion sensor or a $CO_2$ sensor), a specific member presence in the house (e.g., whether a member who overspends electricity stays), temperature measured using a sensor (installable at several points such as a room, a kitchen, or the like), positional information of a vehicle in the house, or the like.

Below Table 2 shows example temperature collected of an outdoor in a region where an electricity consumption measuring device is installed. The temperatures are collected based on data of the Meteorological Administration Agency.

TABLE 2

| Serial No. | Region code | Temperature | Observation time |
|---|---|---|---|
| 1 | 108 | −5.7 | 2014 Jan. 13 15:00:00 |
| 2 | 108 | −6.2 | 2014 Jan. 13 16:00:00 |
| 3 | 108 | −6.6 | 2014 Jan. 13 17:00:00 |
| 4 | 108 | −7.2 | 2014 Jan. 13 18:00:00 |
| 5 | 108 | −7.9 | 2014 Jan. 13 19:00:00 |
| 6 | 108 | −8.1 | 2014 Jan. 13 20:00:00 |
| 7 | 108 | −8.4 | 2014 Jan. 13 21:00:00 |
| 8 | 108 | −8.9 | 2014 Jan. 13 22:00:00 |
| 9 | 108 | −8.6 | 2014 Jan. 13 23:00:00 |

In an embodiment, in the threshold value or more power consumption element determining step (S1316), a correlation coefficient representing a correlation between the extracted power consumption element and the power consumption is calculated to determine the power consumption element having a correlation coefficient which is a predetermined threshold value or more.

That is, a correlation between the power consumption for each home appliance or feeder and the collected power consumption influence elements is analyzed. For example, a correlation between a usage for each time of each feeder and an outdoor temperature of the corresponding time may be digitized by using a Pearson correlation coefficient or a Spearman correlation coefficient. In particular, based on a temperature (e.g., 15 degrees Celsius) with which persons generally feel convenient when calculating a correlation with a temperature, both a correlation coefficient between a temperature which is lower than the corresponding temperature and the power consumption; and a correlation coefficient between a temperature which is higher than the corresponding temperature and the electricity consumption are calculated to set a value having a higher absolute value as the correlation coefficient. This is used to complement that the Pearson correlation coefficient is 0. An example graph illustrating a correlation coefficient using is explained in conjunction with the FIG. 14 (in the case of the temperature). Further, a relationship between the power consumption for each feeder and the temperature are explained in conjunction with the FIG. 15.

Further, in the threshold value or more power consumption element determining step (S1316), an absolute value of the correlation coefficient for each feeder or home appliance is compared with a predetermined threshold value. For example, when the predetermined threshold value is 0.5, the temperature is selected as forecast elements of feeders 9 and 10 as shown in the FIG. 15. When a forecast element that exerts a large influence on a demand of a specific feeder or home appliance is found in advance, the correlation calculating step may be omitted with respect to the corresponding feeders or home appliances.

According to the aforementioned exemplary embodiment, in the power consumption element extracting step (S1310), the one or more power consumption elements for all feeders or home appliances are extracted.

Further, the relationship model generating step (S1320) according to the embodiment will be described. In an embodiment, in the relationship model generating step (S1320), a relationship model representing the relationship between the power consumption summed up for each extracted power consumption element and the power consumption is generated.

That is, usages of the feeders or home appliances having the same power consumption element are all summed up under a given time unit. When the specific feeder or home appliance has a unique characteristic, the usages are not summed up but only the usage of the corresponding feeder or home appliance may be separately considered. In an embodiment, if a single function cannot be obtained from any singularity due to a device of unique characteristic of energy consuming, another function may be generate for the singular device in addition to the general function to enhance the relationship.

Further, the summed-up value may be log-converted or the primitive value may be used as it is. Below Table 3 shows a log conversion value of a total usage of the feeders that sensitively react to the external temperature at 10 A.M. on weekdays and an external temperature measurement value.

TABLE 3

| Serial No. | Observation time | log (consumption + 1) | External temperature |
|---|---|---|---|
| 1 | 2014 Feb. 3 10:00:00 | 9.206443 | −2.7 |
| 2 | 2014 Feb. 4 10:00:00 | 9.131649 | −8.7 |
| 3 | 2014 Feb. 5 10:00:00 | 9.134958 | −6.4 |
| 4 | 2014 Feb. 6 10:00:00 | 9.141014 | −2.5 |
| 5 | 2014 Feb. 7 10:00:00 | 8.916719 | 1.2 |
| 6 | 2014 Feb. 10 10:00:00 | 8.824727 | 0.4 |
| 7 | 2014 Feb. 11 10:00:00 | 7.909074 | −0.3 |
| 8 | 2014 Feb. 12 10:00:00 | 8.114223 | 1.7 |
| 9 | 2014 Feb. 13 10:00:00 | 8.756215 | 1.4 |

Further, in the relationship model generating step (S1320) according to the embodiment, among models that may describe the relationship between the power consumption and the forecast element, a model having a highest description degree of data is selected and a corresponding model coefficient is extracted from the data. For example, the log conversion value of the total usage of the feeders that sensitively react to the external temperature may expressed as a quadric polynomial function of the external temperature and a coefficient of the corresponding model may be calculated through a least square method, or the like.

The various actions, acts, blocks, steps, or the like of the FIG. 3 may be performed in the order presented, in a different order or simultaneously. Further, in some embodiments, some of the actions, acts, blocks, steps, or the like may be omitted, added, modified, skipped, or the like without departing from the scope of the invention.

Figure 14:
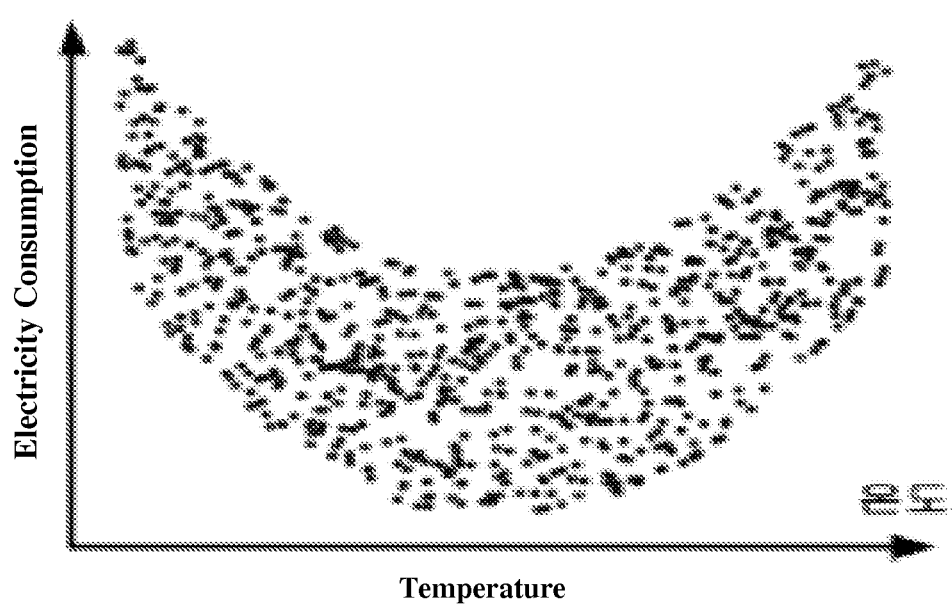
FIG. 14 is a diagram illustrating an example of calculating a correlation coefficient, according to the embodiments as described herein.

FIG. 14 is a diagram illustrating an example of calculating a correlation coefficient, according to the embodiments as described herein. In an embodiment, this is used to complement that the Pearson correlation coefficient is 0 in a usage graph having a form as illustrated in the FIG. 14 in the case of the temperature.

Figure 15:
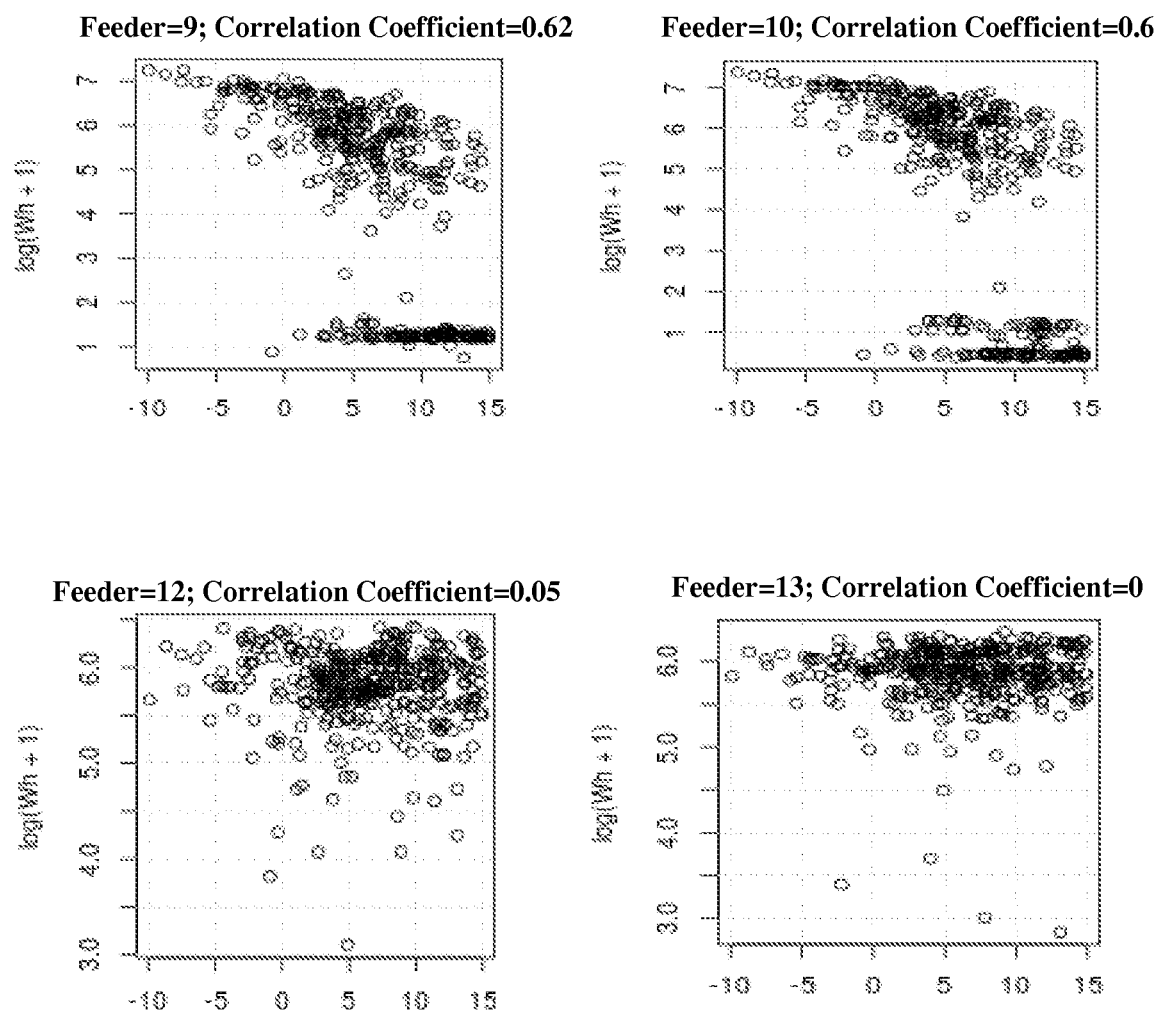
FIG. 15 is a diagram illustrating a relationship between power consumption for each feeder and a temperature, according to the embodiments as described herein.

FIG. 15 is a diagram illustrating a relationship between the power consumption for each feeder and a temperature, according to the embodiments as described herein. In an embodiment, an external temperature of a predetermined building and a usage for each feeder are shown in the graph and the Pearson correlation coefficient is recorded. Only the data of 15 degrees Celsius or less is used and only usage data in a business time period (9 A.M. to 6 P.M.) during the week are considered by using a characteristic (in that the predetermined building is an office building). Herein, as the usage for each feeder, a log converted value (log (power consumption+1)) is used, but a primitive value which is not converted may also be directly used.

Figure 16:
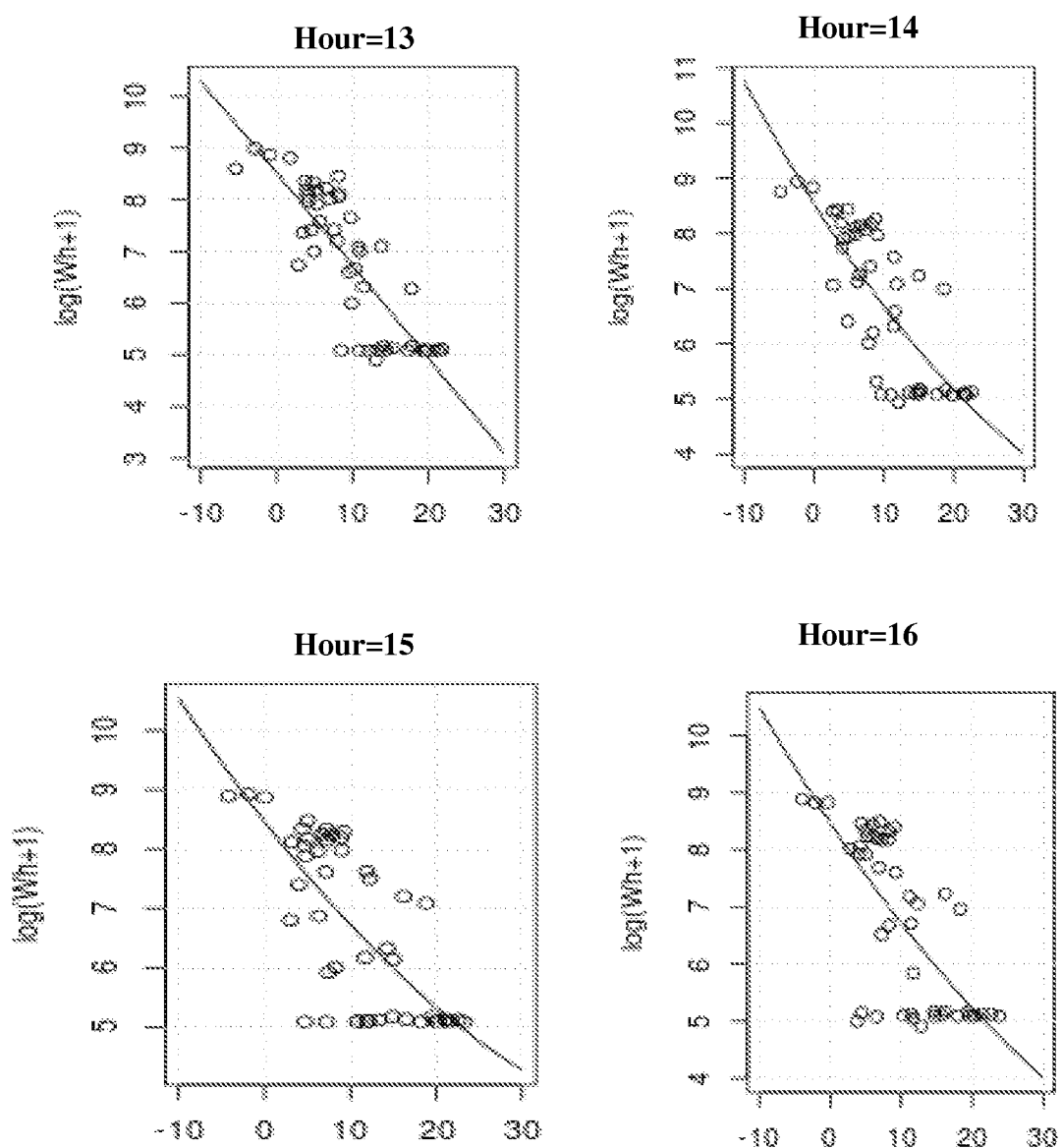
FIG. 16 is a diagram illustrating an example for estimating the relationship between the power consumption and the temperature, according to the embodiments as described herein.

FIG. 16 is a diagram illustrating an example for estimating the relationship between the power consumption and the temperature, according to the embodiments as described herein. In an embodiment, a result of estimating log conversion values of the external temperature and the usage according to the quadric polynomial function are described. B-Spline, or the like may be used for estimation in addition to the polynomial function. When the one or more power consumption elements are available, multi-dimensional surface estimation may be performed by using the polynomial function or the B-Spline function, or the like.

A residual between a value calculated in each relationship model and an actual observation value is named as a virtual feeder or home appliance and, thereafter, may be modeled while being considered as a separate feeder or home appliance in modeling through time-series analysis to be described below.

Usage of all feeders or home appliances in which the power consumption element is not extracted may be all summed up and modeled by using the time-series analysis methods such as Exponential smoothing, Autoregressive Integrated Moving Average (ARIMA), functional analysis, or the like. When the specific feeder or home appliance has a peculiar attribute for the time, the corresponding extracted power consumption elements may not be summed up and may be separately modeled.

Figure 17:
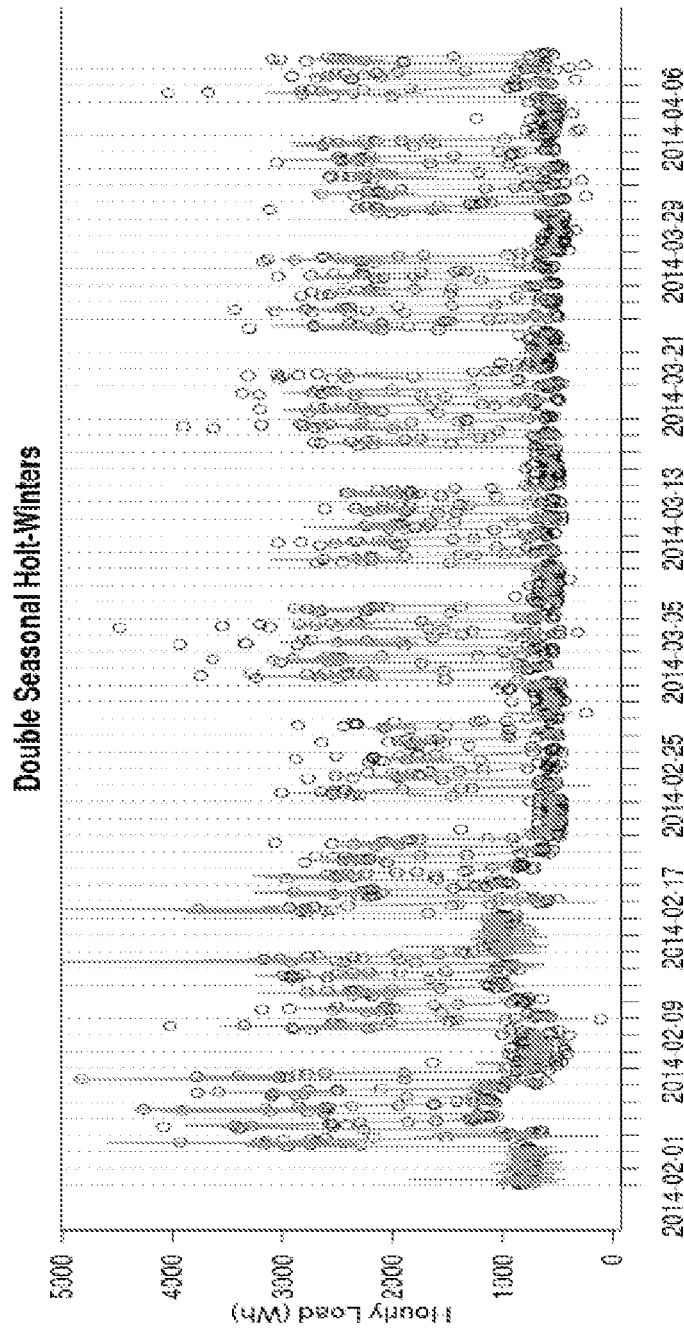
FIG. 17 is a diagram illustrating a modeling example, according to the embodiments as described herein.

FIG. 17 is a diagram illustrating a modeling example, according to the embodiments as described herein. In an embodiment, an example of modeling a sum total of feeders without another forecast element other than the time by using a Double seasonal Holt-Winters method is described. In the method for forecasting the power consumption, the relationship models used for the forecast may be made into a database (stored in advance) and the power consumption may be forecasted by receiving the relationship model. Further, the generated relationship model may be learnedly updated according to an error value.

Figure 18:
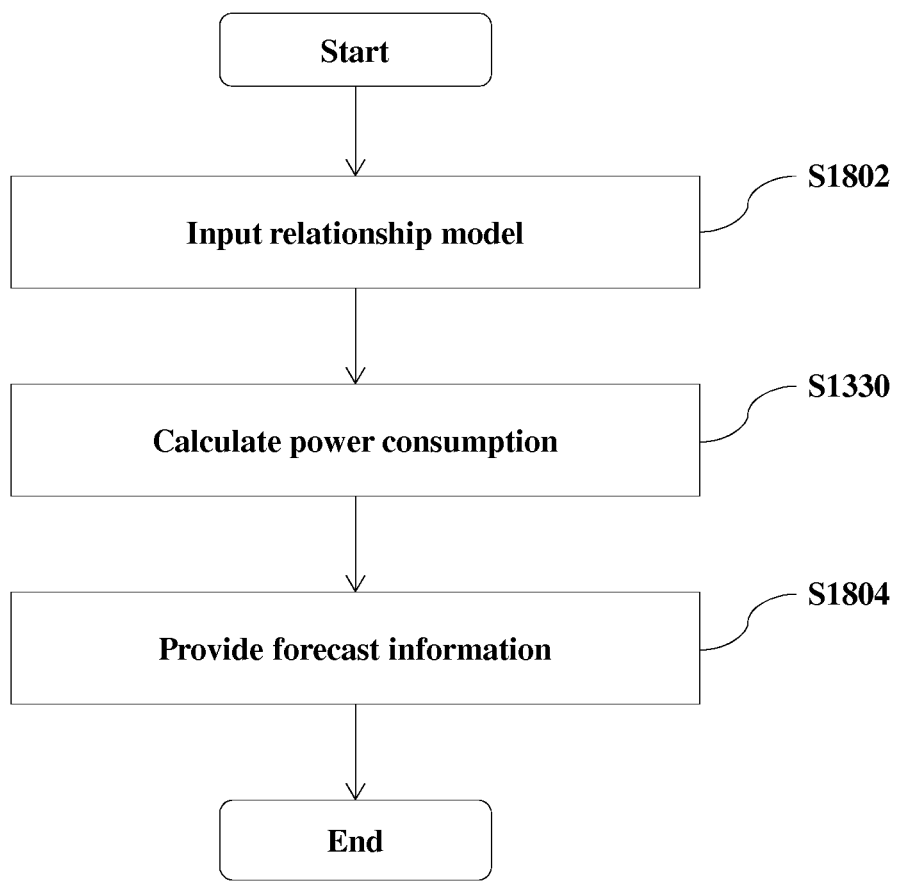
FIG. 18 is a flowchart illustrating a method for forecasting power consumption, according to another exemplary embodiment of the present invention.

FIG. 18 is a flowchart illustrating a method for forecasting power consumption, according to another exemplary embodiment of the present invention. In an embodiment, the method may include a relationship model inputting step (S1802), a power consumption calculating step (S1330), and a forecast information providing step (S1804).

That is, in the relationship model inputting step (S1802), the relationship model generated through the power consumption element extracting step (S1310) and the relationship model generating step (S1320) according to the aforementioned embodiment is the input.

Further, in the power consumption calculating step (S1330), the power consumption is calculated through the input relationship model. In the forecast information providing step (S1804), additional information based on the calculated power consumption is provided. That is, in an embodiment, in the forecast information providing step (S1804) as a step of providing the calculated power consumption, the energy consumption is forecasted for each time and values after a predetermined time (e.g., after 24 hours) are summed up to present a forecast value for each date.

Further, as additional information, a cumulative usage or a power consumption peak time may be notified in advance. That is, a forecast system manager or a forecast system user foretells a reach time of a predetermined cumulative usage. For example, when the cumulative usage of the corresponding month belongs to cumulative step 1 of a personal household at present and entrance of cumulative step 2 is anticipated after three days, this may be notified in advance. Further, a maximum value of a usage per hour on a next day and a time interval in which the corresponding maximum value is generated may be notified in advance.

As additional information, an abnormal symptom of the home appliance may be supposed and notified. That is, in the present invention, the energy consumption for each feeder or home appliance is forecasted. When an actual usage of the specific feeder or home appliance is excessively different from a forecast value, it may be notified that an error occurs in at least one of the corresponding home appliance or at least one of home appliances connected to the corresponding feeder.

Herein, the excessive difference may be defined as a case in which an absolute value of a difference between a forecast value Pi and an actual observation value Oi is larger than a value acquired by multiplying a standard deviation $\sigma$ of the observed value by a predetermined value $\theta$ ($|Pi-Oi|>\theta\times\sigma$) as described below. In this case, the forecast value and the observed value are log-converted to be compared. When the forecast value and the observed value of the power consumption are compared with each other, one or more of apparent power consumption, idle power consumption, and reactive power consumption may be compared with each other.

Values at one moment are compared to notify the abnormal symptom, but when Si defined, as below, is equal to or more than a predetermined value by using a cumulative summation chart (CUSUM), the abnormal symptom may be notified.

$$S_i = \max(S_i + l_i, 0), \qquad \text{[Equation 1]}$$
$$l_i = \log(P(d = d_i|\text{abnormal})) - \log(P(d = d_i|\text{normal})),$$
$$d_i = \begin{cases} 1 & \text{if } |P_i - O_i| > \theta\sigma, \\ 0 & \text{otherwise.} \end{cases}$$

Herein, P (d=1|abnormal) and P (d=1|normal) and respective probabilities are values calculated in the previous observation or a prior knowledge.

Figure 19:
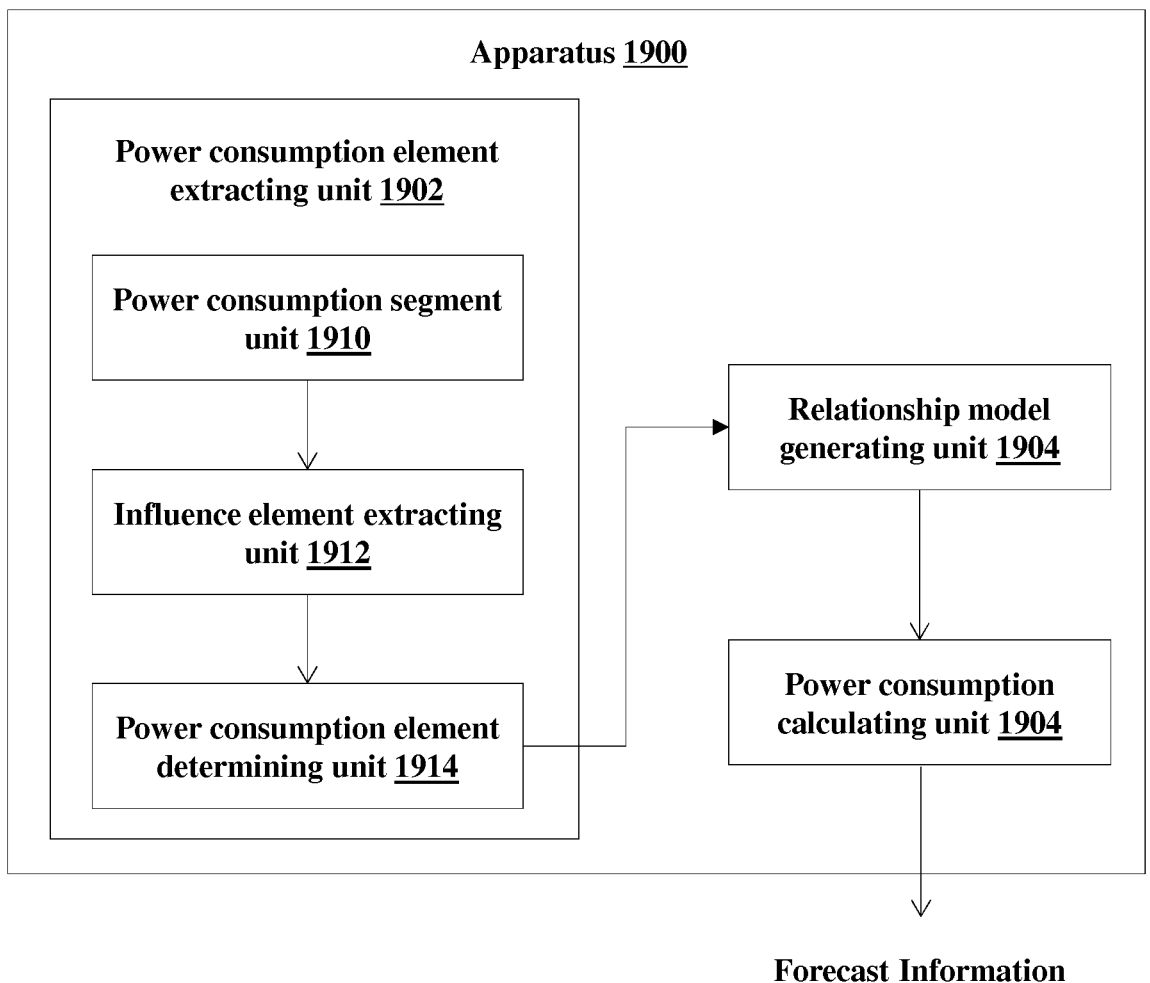
FIG. 19 is a block diagram illustrating an apparatus for forecasting power consumption based on consumption characteristics, according to the embodiments as described herein.

An apparatus that performs the method for forecasting the power consumption based on the consumption characteristics according to the exemplary embodiment may be configured as illustrated in the FIG. 19.

The various actions, acts, blocks, steps, or the like of the FIG. 18 may be performed in the order presented, in a different order or simultaneously. Further, in some embodiments, some of the actions, acts, blocks, steps, or the like may be omitted, added, modified, skipped, or the like without departing from the scope of the invention.

The FIG. 19 is a block diagram illustrating an apparatus 1900 for forecasting power consumption based on consumption characteristics, according to the embodiments as described herein. In an embodiment, the apparatus 1900 includes a power consumption element extracting unit 1902, a relationship model generating unit 1904, and a power consumption calculating unit 1906.

In an embodiment, in the power consumption element extracting unit 1902, a power consumption segmenting unit 1908 is configured to segment power consumption for each feeder that supplies power for each apparatus that consumes the power per time, an influence element extracting unit 1910 configured to extract at least one power consumption element that influences power consumption, and a power consumption element determining unit 1912 configured to determine a power consumption element which is equal to or more than a threshold value. The relationship model generating unit 1904 is configured to generate a relationship model representing the relationship between power consumption summed up for each extracted power consumption element and the power consumption element. The power consumption calculating unit 1906 is configured to calculate the power consumption through the generated relationship model.

Further, although not illustrated, the apparatus 1900 may be constituted by a relationship model inputting unit receiving a relationship model stored in a separate database, a power consumption calculating unit calculating the power consumption through the relationship model input unit, and a forecast information providing unit providing information through the calculated power consumption.

The FIG. 19 illustrates a limited overview of the apparatus 1900 for forecasting the power consumption based on consumption characteristics but, it is to be understood that other embodiments are not limited thereto. The labels provided to each unit or component is only for illustrative purpose and does not limit the scope of the invention. Further, the one or more modules can be combined or separated to perform the similar or substantially similar functionalities without departing from the scope of the invention. Furthermore, the apparatus 1900 can include various other components interacting locally or remotely along with other hardware or software components to forecast the power consumption based on consumption characteristics. For example, the component can be, but is not limited to, a process running in the controller or processor, an object, an executable process, a thread of execution, a program, or a computer.

The foregoing description of the specific embodiments will so fully reveal the general nature of the embodiments herein that others can, by applying current knowledge, readily modify or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the technical spirit and scope of the embodiments as described herein.

What is claimed is:

1. A server for managing power demand, the server comprising circuitry configured to:
   receive a request signal for power usage reduction from a power supply enterprise related server;
   select a subscriber corresponding to said request signal based on subscriber information;
   transmit guidance information for said power usage reduction to a communicating device of said subscriber and transmit a command to control a load apparatus or to schedule a control of the load apparatus;
   detect whether the load apparatus is in a transient state or a steady state, generate a data set including a snapshot when the load apparatus is in a steady state, and generate a data set including a plurality of snapshots when the load apparatus is in a transient state;
   compute a signal correlation to reflect power information of the load apparatus based on the snapshot of the power signal or based the plurality of the snapshots depending on whether the load apparatus is in the steady state or the transient state;
   classify said power information based on component units constituting the load apparatus based on the signal correlation of said selected subscriber to generate the data set for the component units based on the classified power information, and map and recombine the classified data set;
   monitor a power consumption by the load apparatus based on the recombined classified data set; and
   grant a compensation to said subscriber, when said power consumption by the load apparatus is reduced in accordance to said guidance information;
   wherein said subscriber information is stored in a memory, wherein said subscriber information includes:
     power consumption by the load apparatus of said subscriber; and
     a probability distribution function of the power usage reduction depending on a compensation to the subscriber; and
   wherein said subscriber is selected based on the power consumption and the probability distribution function included in said subscriber information.

2. The server of claim 1, wherein said subscriber information further includes at least one of:
   temporal power consumption by the load apparatus of each said subscriber,
   power usage reduction history according to said guidance information for each said subscriber, and
   predicted power consumption by the load apparatus of each said subscriber.

3. The server of claim 1, wherein said request signal includes information on at least one of reduction requirement of power consumption for power usage, operation mode for the load apparatus, a reduction required time zone, and a reduction required region.

4. The server of claim 1, wherein said guidance information includes information on at least one of reduced power consumption required for said selected subscriber, a power usage status of said selected subscriber, a reduction required time zone, and a compensation depending on reduction.

5. The server of claim 1, wherein said server further comprises a sponsor server for acquiring a carbon dioxide emission right from a carbon dioxide emission right transaction server based on said reduced power consumption, wherein said carbon dioxide emission right transaction server is for verifying said reduced power consumption from said server.

6. The server of claim 1, wherein information on said granted compensation is transmitted to said communicating device of said subscriber.

7. The server of claim 1, wherein said information on said reduced power consumption according to said guidance information for each said subscriber is transmitted to a power supply enterprise related server.

8. The server of claim 1, wherein said server receives said power consumption measured in an energy measuring apparatus installed at a penetration point of power of said subscriber, wherein said power consumption for the load apparatus is calculated by a labeling server.

9. The server of claim 8, wherein said power consumption for the load apparatus calculated by said labeling server is monitored by said server.

10. A system for managing a power demand, said system comprising:
    a server which selects a subscriber and requests power usage reduction based on subscriber information in response to receiving a request signal for said power usage reduction, transmits guidance information for said power usage reduction to a communicating device of said selected subscriber and transmits a command to control a load of apparatuses or to schedule a control of the load of the apparatuses, detects whether a load apparatus is in a transient state or a steady state, generates a data set including a snapshot when the load apparatus is in a steady state, and generates a data set including a plurality of snapshots when the load apparatus is in a transient state, computes a signal correlation to reflect power information of the load apparatus based on the snapshot of a power signal or based the plurality of the snapshots depending on whether the load apparatus is in the steady state or the transient state, classifies said power information based on component units constituting the load apparatus based on the signal correlation of said selected subscriber to generate the data set for the component units based on the classified power information, maps and recombines the classified data set, and monitors a power consumption by the load apparatus based on the recombined classified data set;

wherein said communicating device configured to execute a power related application in response to receiving said guidance information from said server, and output said guidance information;

wherein said server grants a compensation to said selected subscriber, when power consumption by the load apparatus of said selected subscriber is reduced in accordance to said guidance information;

wherein said subscriber information includes:
  power consumption by at least one apparatus of said subscriber: and
  a probability distribution function of the power usage reduction depending on a compensation to the subscriber; and wherein said subscriber is selected based on the power consumption and the probability distribution function included in said subscriber information.

11. A method for managing power usage, said method comprising:
  receiving a request signal for power usage reduction:
  selecting a subscriber corresponding to said request signal based on said subscriber information;
  transmitting guidance information for said power usage reduction to a communicating device of said subscriber and transmitting a command to control load of apparatuses or to schedule a control of the load of the apparatuses;
  detecting whether a load apparatus is in a transient state or a steady state, generating a data set including a snapshot when the load apparatus is in a steady state, and generating a data set including a plurality of snapshots when the load apparatus is in a transient state;
  computing a signal correlation to reflect power information of the load apparatus based on the snapshot of a power signal or based the plurality of the snapshots depending on whether the load apparatus is in the steady state or the transient state;
  classifying said power information based on component units constituting a load apparatus based on the signal correlation of said selected subscriber to generate a data set for the component units based on the classified power information;
  mapping and recombining the classified data set;
  monitoring a power consumption by the load apparatus based on the recombined classified data set; and
  granting a compensation to said subscriber when said power consumption by the load apparatus is reduced according to said guidance information;

wherein said subscriber information includes:
  power consumption by the load apparatus of said subscriber; and
  a probability distribution function of the power usage reduction depending on a compensation to the subscriber; and wherein said subscriber is selected based on the power consumption and the probability distribution function included in said subscriber information.

12. The method of claim 11, wherein said subscriber information further includes at least one of:
  temporal power consumption by the load apparatus of each said subscriber, and
  predicted power consumption by the load apparatus of each said subscriber.

13. The method of claim 11, further comprising:
  transmitting information on said granted compensation to said communicating device of said subscriber.

14. The method of claim 11, further comprising:
  transmitting information on said reduced power consumption according to said guidance information for each said subscriber to a power supply related server.

15. The server of claim 8, wherein the labeling server labels recombined data sets.

16. The system of claim 10, further comprising a labeling server which labels recombined data sets.

17. The method of claim 11, further comprising labeling recombined data sets using a labeling server.

18. The server of claim 1, wherein the circuitry is further configured to select a frequency at which the snapshot or the snapshots of the power signal is extracted from a range of 10 to 900 Hz.

19. The server of claim 10, wherein the server selects a frequency at which the snapshot or the snapshots of the power signal is extracted from a range of 10 to 900 Hz.

20. The method of claim 11, further comprising selecting a frequency at which the snapshot or the snapshots of the power signal is extracted from a range of 10 to 900 Hz.

* * * * *